US005182727A

United States Patent [19]

McFalls, Jr. et al.

[11] Patent Number: 5,182,727

[45] Date of Patent: Jan. 26, 1993

[54] ARRAY LAYOUT STRUCTURE FOR IMPLEMENTING LARGE HIGH-DENSITY ADDRESS DECODERS FOR GATE ARRAY MEMORIES

[75] Inventors: Charles S. McFalls, Jr., Durham; Patrick A. Sproule, Raleigh; Michael A. Mullins, Durham, all of N.C.

[73] Assignee: Mitsubishi Semiconductor America, Inc., Durham, N.C.

[21] Appl. No.: 773,827

[22] Filed: Oct. 9, 1991

[51] Int. Cl.$^5$ .............................................. G11C 13/00

[52] U.S. Cl. ........................... 365/230.06; 365/230.01

[58] Field of Search ...................... 365/230.01, 230.06, 365/189.05

[56] References Cited

U.S. PATENT DOCUMENTS 4,423,432 12/1983 Stewart et al. .
4,429,374 1/1984 Tanimura .
4,514,829 4/1985 Chao .
4,564,773 1/1986 Tanizawa et al. .
4,618,784 10/1986 Chappell et al. .
4,642,798 2/1987 Rao .
4,777,390 10/1988 Hoshi .
4,818,900 4/1989 Klass et al. .
4,843,261 6/1989 Chappell et al. .
4,851,716 7/1989 Needles et al. .
4,996,168 2/1991 Ozaki et al. .

OTHER PUBLICATIONS

A. Abd-Alla and A. Meltzer, Principles of Digital Computer Design, vol. 1 (1976), pp. 165–171.

*Primary Examiner*—Terrell W. Fears
*Attorney, Agent, or Firm*—Lowe, Price, LeBlanc & Becker

[57] ABSTRACT

An 8-to-256 address signal decoder is composed of sixteen 4-to-16 output decoders. Each 4-to-16 decoder is subdivided into eight sub-functions having outputs ANDed together using sixteen OR gates. Each 4-input NAND gate of a conventional rectangular decoder is replaced by two input sub-function NANDs feeding an OR gate. The two sub-function NANDs are positioned outside a high density region, whereas the OR gates reside within a high density region below a memory cell array. The sixteen OR gates are distributed in a 4×4 array format. Each OR gate column is four basic cells wide, and there are four output lines for each column of OR gates to conform to dense memory cell layout criteria. The array structure requires only one vertical input line per column and one horizontal input line per row to reach each OR gate. Inverting drivers required to complete the 4-to-16 output decoders are arranged in a 4×4 array. The position of each inverter corresponds to the OR gate that drives it.

40 Claims, 26 Drawing Sheets

BREAKDOWN OF OUTPUTS INTO SUBFUNCTIONS

| | |
|---|---|
| 0 | $\overline{\bar{A}\,\bar{B}\,\bar{C}\,\bar{D}} = \overline{\bar{A}\,\bar{B}} + \overline{\bar{C}\,\bar{D}}$ |
| 1 | $\overline{\bar{A}\,\bar{B}\,\bar{C}\,D} = \overline{\bar{A}\,\bar{B}} + \overline{\bar{C}\,D}$ |
| 2 | $\overline{\bar{A}\,\bar{B}\,C\,\bar{D}} = \overline{\bar{A}\,\bar{B}} + \overline{C\,\bar{D}}$ |
| 3 | $\overline{\bar{A}\,\bar{B}\,C\,D} = \overline{\bar{A}\,\bar{B}} + \overline{C\,D}$ |
| 4 | $\overline{\bar{A}\,B\,\bar{C}\,\bar{D}} = \overline{\bar{A}\,B} + \overline{\bar{C}\,\bar{D}}$ |
| 5 | $\overline{\bar{A}\,B\,\bar{C}\,D} = \overline{\bar{A}\,B} + \overline{\bar{C}\,D}$ |
| 6 | $\overline{\bar{A}\,B\,C\,\bar{D}} = \overline{\bar{A}\,B} + \overline{C\,\bar{D}}$ |
| 7 | $\overline{\bar{A}\,B\,C\,D} = \overline{\bar{A}\,B} + \overline{C\,D}$ |
| 8 | $\overline{A\,\bar{B}\,\bar{C}\,\bar{D}} = \overline{A\,\bar{B}} + \overline{\bar{C}\,\bar{D}}$ |
| 9 | $\overline{A\,\bar{B}\,\bar{C}\,D} = \overline{A\,\bar{B}} + \overline{\bar{C}\,D}$ |
| 10 | $\overline{A\,\bar{B}\,C\,\bar{D}} = \overline{A\,\bar{B}} + \overline{C\,\bar{D}}$ |
| 11 | $\overline{A\,\bar{B}\,C\,D} = \overline{A\,\bar{B}} + \overline{C\,D}$ |
| 12 | $\overline{A\,B\,\bar{C}\,\bar{D}} = \overline{A\,B} + \overline{\bar{C}\,\bar{D}}$ |
| 13 | $\overline{A\,B\,\bar{C}\,D} = \overline{A\,B} + \overline{\bar{C}\,D}$ |
| 14 | $\overline{A\,B\,C\,\bar{D}} = \overline{A\,B} + \overline{C\,\bar{D}}$ |
| 15 | $\overline{A\,B\,C\,D} = \overline{A\,B} + \overline{C\,D}$ |

FIG. 12

EXTRACTED SUBFUNCTIONS

| | |
|---|---|
| $A1 = \overline{\bar{A}\,\bar{B}}$ | AB NANDS |
| $A2 = \overline{\bar{A}\,B}$ | |
| $A3 = \overline{A\,\bar{B}}$ | |
| $A4 = \overline{A\,B}$ | |
| $A5 = \overline{\bar{C}\,\bar{D}}$ | CD NANDS |
| $A6 = \overline{\bar{C}\,D}$ | |
| $A7 = \overline{C\,\bar{D}}$ | |
| $A8 = \overline{C\,D}$ | |

FIG. 13

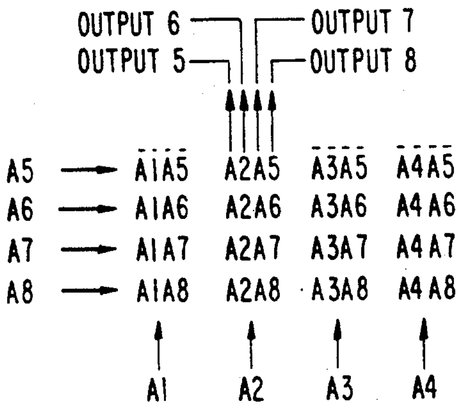

FIG. 14

BREAKDOWN OF OUTPUTS INTO SUBFUNCTIONS

| | | | |
|---|---|---|---|
| 0 | $\overline{A}\overline{B}\overline{C}\overline{D}$ | = | $\overline{(A + B)} \ \overline{(C + D)}$ |
| 1 | $\overline{A}\overline{B}\overline{C}D$ | = | $\overline{(A + B)} \ \overline{(\overline{C} + D)}$ |
| 2 | $\overline{A}\overline{B}C\overline{D}$ | = | $\overline{(A + B)} \ \overline{(C + \overline{D})}$ |
| 3 | $\overline{A}\overline{B}CD$ | = | $\overline{(A + B)} \ \overline{(\overline{C} + \overline{D})}$ |
| 4 | $\overline{A}B\overline{C}\overline{D}$ | = | $\overline{(A + \overline{B})} \ \overline{(C + D)}$ |
| 5 | $\overline{A}B\overline{C}D$ | = | $\overline{(A + \overline{B})} \ \overline{(\overline{C} + D)}$ |
| 6 | $\overline{A}BC\overline{D}$ | = | $\overline{(A + \overline{B})} \ \overline{(C + \overline{D})}$ |
| 7 | $\overline{A}BCD$ | = | $\overline{(A + \overline{B})} \ \overline{(\overline{C} + \overline{D})}$ |
| 8 | $A\overline{B}\overline{C}\overline{D}$ | = | $\overline{(\overline{A} + B)} \ \overline{(C + D)}$ |
| 9 | $A\overline{B}\overline{C}D$ | = | $\overline{(\overline{A} + B)} \ \overline{(\overline{C} + D)}$ |
| 10 | $A\overline{B}C\overline{D}$ | = | $\overline{(\overline{A} + B)} \ \overline{(C + \overline{D})}$ |
| 11 | $A\overline{B}CD$ | = | $\overline{(\overline{A} + B)} \ \overline{(\overline{C} + \overline{D})}$ |
| 12 | $AB\overline{C}\overline{D}$ | = | $\overline{(\overline{A} + \overline{B})} \ \overline{(C + D)}$ |
| 13 | $AB\overline{C}D$ | = | $\overline{(\overline{A} + \overline{B})} \ \overline{(\overline{C} + D)}$ |
| 14 | $ABC\overline{D}$ | = | $\overline{(\overline{A} + \overline{B})} \ \overline{(C + \overline{D})}$ |
| 15 | $ABCD$ | = | $\overline{(\overline{A} + \overline{B})} \ \overline{(\overline{C} + \overline{D})}$ |

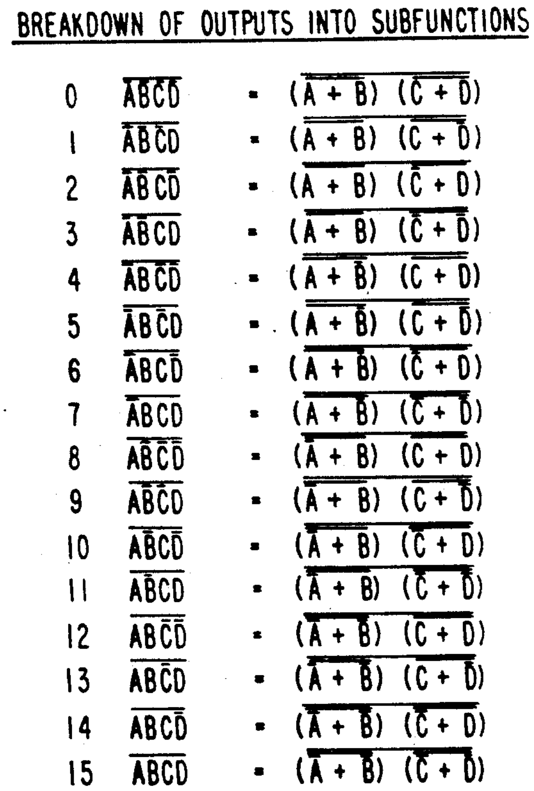

FIG. 15

EXTRACTED SUBFUNCTIONS

A1' = $\overline{A + B}$ ⎫
A2' = $\overline{A + \overline{B}}$ ⎬ AB NORS
A3' = $\overline{\overline{A} + B}$ ⎪
A4' = $\overline{\overline{A} + \overline{B}}$ ⎭
─────────────
A5' = $\overline{C + D}$ ⎫
A6' = $\overline{C + \overline{D}}$ ⎬ CD NORS
A7' = $\overline{\overline{C} + D}$ ⎪
A8' = $\overline{\overline{C} + \overline{D}}$ ⎭

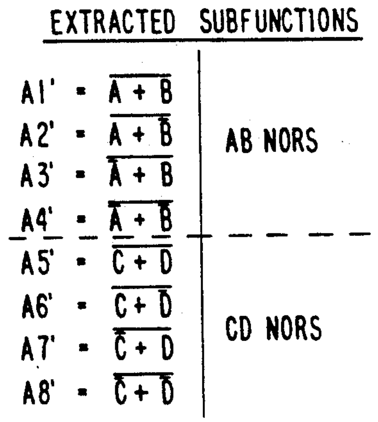

FIG. 16

ARRAY LAYOUT STRUCTURE FOR IMPLEMENTING LARGE HIGH-DENSITY ADDRESS DECODERS FOR GATE ARRAY MEMORIES

TECHNICAL FIELD

The present invention relates to semiconductor memories and, more specifically, to an address signal decoder for a semiconductor memory including decoding circuitry formed in a square array for decoding subdecoded address signals.

BACKGROUND ART

FIG. 1 is a block diagram of a conventional dynamic random access memory (DRAM) having 65,536 (64K) memory cells configured in 256 rows along 256 columns. Externally supplied address signals are used to select one of the memory cells to store or retrieve data.

DRAM 1 includes a square array of memory cells 25 connected at crossovers of bit and word lines arranged in 256 rows and 256 columns. Row and Column Address Buffer 21 sequentially receives an eight-bit row address signal and an eight-bit column address signal from address input terminals $A_1$–$A_8$. The eight-bit row address signal is supplied to Row Decoder 22 which decodes the signal to select one of the 256 word lines. The word lines receive the decoded row address signal from Row Decoder 22 for selecting memory cells connected to the selected word line.

The bit lines of Memory Cell Array 25 are connected to bit line sense amplifiers and input/output gates of Sense Refresh Amplifier and I/O Control 24. Data to be stored into a selected memory cell is received into Data In Buffer 26 which supplies data input signals to Sense Refresh Amplifier and I/O Control 24.

Column decoder 23 decodes the 8-bit column address signal from Row & Column Buffer 21 to supply a decoded column address signal to Sense Refresh Amplifier and I/O Control 24 for selecting one of the sense amplifiers. A data signal from the selected sense amplifier of Memory Cell Array 25 is supplied to Data Out Buffer 27 through Sense Refresh Amplifier and I/O Control 24.

Power, data and control signals are received at power input terminals 2 and 3, Row Address Strobe ($\overline{RAS}$) input terminal 4, Column Address Strobe ($\overline{CAS}$) terminal 8, and Write Enable Terminal $\overline{W}$. Clock Generator Circuit 10 receives $\overline{RAS}$ and $\overline{CAS}$ signals to supply a first clock signal $\phi_1$ to Column Decoder 23 and a second clock signal $\phi_2$ to AND gate 28. AND gate 28 receives clock signal $\phi_2$ and a write enable signal for supplying data strobe signals to Data In Buffer 26 and Data Out Buffer 27.

In operation, clock generator 10 $\overline{RAS}$ and $\overline{CAS}$ signals are supplied from a central processing unit (CPU) not shown. In response to the $\overline{RAS}$ and $\overline{CAS}$ signals, clock generator circuit 10 develops clock signals $\phi_1$ and $\phi_2$. During normal read/write operations of the DRAM, address signal buffer 21 receives 16 bits of address signal data in two sequential 8 bit bytes at external address signal input terminals $A_1$–$A_8$. The sixteen bit address signal includes an eight bit row address signal portion and an eight bit column address signal portion.

Address signal buffer 21 supplies the row and column bytes of address signal data on a time multiplex basis to row decoder 22 and column decoder 23. Row decoder 22 and column decoder 23 decode the internal address signals $A_1$–$A_8$ and apply the decoded signals to memory cell array 25 and I/O controller 24. In response to the row address signal data supplied to row decoder 22, a row of memory cells is selected from memory cell array 25. Column address signal data applied to column decoder 23 enables reading from or writing to the selected column of memory cells. The memory cell of memory cell array 25 in the selected row and column can then be accessed for data storage or retrieval.

Data to be stored in a memory cell is received as a data signal at the Data Input terminal and stored in buffer 26. In response to a first write enable signal $\overline{W}$ and a clock signal $\phi_2$, data is transferred from buffer 26 to I/O signal controller 24. Column decoder 23 is enabled by clock signal $\phi_1$ to supply data to memory cells in the selected column of the memory cell array. However, because only memory cells in the row selected by row decoder 22 are enabled, data is stored only in the memory cell having the selected row and column address signals.

FIG. 2 is a block diagram showing the memory cell array of the DRAM in further detail. Each memory cell comprises a data storage capacitor connected through a gate transistor to one bit line of a bit line pair. The gate electrodes of the gate transistors are connected to the word lines which, in turn, are connected to the Row Decoder 22. Sense amplifiers S/A receive decoded address signals from Column Decoder 23 for amplifying data signals present on the bit line pairs.

In response to the row address signal, row decoder 22 applies a high output level select signal to a selected one of 256 word lines WL. The select signal causes the gate transistors connected to the selected word line WL to become conductive, allowing a transfer of charge between the associated data storage capacitor and the associated bit line pair BL. During a read operation, sense amplifiers S/A are activated to respond to the charge read out from the storage capacitors of the selected row to the bit line pairs. In response to the column address signal, column decoder 23 activates a transfer gate (not shown) in a selected column to transfer the amplified data signal from the selected bit line pair BL to Data Output Buffer 27 (FIG. 1). The data is supplied at a data output terminal in response to signal clock $\phi_2$.

During a write operation, data from Data In Buffer 26 is supplied to the sense amplifier of the selected column in response to the column address signal applied to column decoder 23. Row Decoder 22 provides a high level signal to the selected word line WL in response to the row address signal, turning on the associated gate transistors of the selected row. With the transistor turned on, a data charge is transferred from the bit lines to the storage capacitor of the selected column. Because no data is applied to the non-selected sense amplifiers, data stored in memory cells of non-selected columns is refreshed but not altered.

The function of the address signal decoders, i.e., the row and column decoders, is to receive binary address signal data and, in response, to provide an output on a corresponding output line. As described, the row decoder provides a high level signal to a word line to cause gate transistors in the associated row to become conductive. The column decoder activates a selected gate to connect a bit line pair to the memory I/O buffer. A simplified schematic diagram of a conventional "rectangular" 8 in—256 out address signal decoder is shown in FIG. 3.

Referring to FIG. 3, a rectangular decoder includes a linear array of AND gates, each having a number of inputs equal to the number of bit signals to be decoded. The number of AND gates is equal to the number of output address signal lines to be selected. The decoder includes inverting buffer amplifiers supplying true address signals to true address signal line 13 and inverted address signals to inverted address signal line 14. In the example of FIG. 3, sixteen inverting amplifiers 11 and 12 provide true and inverted address signals $a_0$–$a_7$ to address signal lines 13 and 14. Each of 256 AND gates 16 has eight input terminals for receiving different combinations of the true and inverted address signals $a_0$–$a_7$.

In operation, an 8 bit address signal $a_0$–$a_7$ is applied to a buffer stage including inverting amplifiers 11 and 12 to supply buffered true address signals to lines 13 and inverted address signals to lines 14. Each of the eight inputs 15 of AND gates 16 is connected to either the true or complemented address signal line for each of the 8 address signal bits $a_0$–$a_7$. Output 17 from the 256 AND gates provide mutually exclusive output signals $Y_0$–$Y_{255}$ in response to the address signal data supplied to the buffer inverter amplifiers.

One problem with the rectangular address signal decoder configuration shown in FIG. 3 arises from the complexity of the 8 input AND gates required to implement the decoder function and from the number and configuration of connections required. Further, drivability problems arise since each address signal line "fans out" to drive 128 AND gates.

Another drawback of the rectangular decoder shown in FIG. 3 results from increased spacing or "pitch" between select output lines 17 caused by the number of devices required to implement the 8 input AND gates 16. A rectangular memory address signal decoder implemented as shown in FIG. 3 has a large output line pitch in comparison with the width of the memory cell array.

To minimize the number of gate inputs, memory devices have been implemented using multiple stages of address signal decoding. A predecode circuit is responsive to the data bits of an original input address signal for supplying subdecoded address signals. A plurality of decoder units is responsive to different combinations of the original input address signal bits and the subdecoded signals to provide selector output signals onto corresponding output lines. A representative circuit for decoding an address signal is described in Hoshi, U.S. Pat. No. 4,777,390. However, these decoding circuits still require decoder logic gates having three or more inputs to provide decoded output signals.

An alternative address signal decoder arrangement is shown in FIGS. 4 and 5. FIG. 4 is a schematic diagram of a subdecoder of a first dual-tree type address signal decoders for supplying a first group of subfunction signals $f_0$–$f_{15}$ in response to address signals $a_0$–$a_3$. A second subdecoder receives address signals $a_4$–$a_7$ for supplying a second group of subfunction signals $f_{16}$–$f_{31}$. Each subdecoder comprises an array of sixteen AND gates arranged in a $4\times4$ matrix.

The first and second groups of subfunction signals are applied through respective amplifiers to an array decoder comprising a $16\times16$ matrix of AND gates as shown in FIG. 5. In response to the two groups of subfunction signals, the array decoder supplies 256 mutually exclusive select signals representing the decoded address signals.

The dual-tree decoder minimizes the number of inputs to each logic element, thereby eliminating the requirement for AND gates having more than two-inputs. However, each subfunction signal must drive multiple AND gates which introduces drivability problems and increases decoding propagation delays. Further, complex signal routing paths are required to distribute the subfunction signals to and within the decoder and to supply decoder output signals to the word lines of an associated memory cell array.

Further, subdecoding type address signal decoders mismatch the pitch of decoder gate output lines and the nominal pitch of word lines of a memory array. While a DRAM memory cell array requires a single gate transistor in combination with a storage capacitor for each cell, the multiple input decoder gates associated with each word line require multiple transistors. Accordingly, the decoder circuitry must be wider than the associated memory cell array. A similar problem is present in a Static RAM (SRAM) memory cell array. Although an array of SRAM memory cells may be wider than a comparable array of DRAM cells, the distance between SRAM memory cells is less than the distance between decoder gate output lines. That is, the pitch of the SRAM word lines is less than the pitch of the corresponding decoder output lines.

Alternatively, the decoder gates must be formed in several rows, complicating signal routing to and from the gates. Forming an address signal decoder using several rows of gates requires that input and output gates be routed across or around adjacent circuits For example, FIG. 6 is a diagram of a single-poly, double-metal CMOS integrated circuit. A gate array includes rows 30 and 40 of serially connected p-type and n-type transistors 32 and 42. A pair of adjacent transistor rows including p-type row 30 and n-type row 40 form a bench 50. A pair of adjacent transistors, an n-type and p-type, form a basic cell 52.

P-type transistor 32, formed in p-type row 30, includes a polysilicon gate 34 separating first and second source drain regions 36 and 38. Similarly, n-type transistor 42 includes first and second source/drain regions 46 and 48 on opposite sides of polysilicon gate 44. Interconnect wiring is provided in routing channel 60 along metal-1 routing tracks 62 to provide conductivity in a row direction and metal-2 routing tracks 64 to provide conductivity in a column direction. The designations metal-1 and metal-2 refer to respective lower and upper metal conductive layers formed during sequential circuit fabrication processing steps. The metal-1 layer is insulated from the metal-2 layer by an interlayer insulator. Typically, localized internal wiring within or among adjacent basic cells uses metal-1 interconnections; metal-2 routings provide interbench connectivity. $V_{cc}$ bus 54 and $V_{ss}$ bus 56 use metal-1 routings to provide power in a row direction over the lower metalization layer to transistors of each basic cell.

A cross-section of a typical CMOS device is shown in FIG. 7. P-type substrate 70 includes a p-well 72 and an n-well 74. A p-type field effect- transistor (FET) is formed on the surface of substrate 70 in the region of p-well 72. The p-type FET includes a gate electrode insulator 76 formed on the surface of the substrate. A polycide gate electrode is formed on gate electrode insulator 76 and includes a gate electrode lower layer 78 made of polysilicon and an upper metal silicide layer made of, for example, tungsten silicide Gate electrode 78, 80 is formed above a channel region with gate electrode sidewall insulators 82 formed on the sidewalls of the gate electrode.

To avoid hot carrier generation, the p-type FET includes a lightly doped drain (LDD) structure with a low concentration $n^-$ region 84 formed under sidewall insulators 82 and a higher concentration $n^+$ region 86 formed distant from the gate electrode.

An n-type FET is formed in n-well region 74 of substrate 70, and includes a polycide gate electrode having a polysilicon lower layer 90 and a metal silicide upper layer 92. Sidewall insulators 93 are formed on opposite sidewalls of the gate electrode. Source/drain regions 96 are formed in the upper surface of the substrate on opposite sides of a channel region below the gate electrode.

Inter-element isolation regions 94 electrically isolate the FETs along the surface of the substrate. An interlayer insulator 98 is formed over the inter-element isolation regions and the gate electrodes. A lower metal-1 routing includes a first polycide interconnect layer 100 extending into a contact hole through interlayer insulation 98 to form a source/drain electrode. Metal-1 polycide interconnection layer 100 includes a lower metal nitride layer 106 and an upper metal polycide layer 108. The metal nitride layer may include, for example, titanium nitride. Similar metal-1 polycide layers 102 and 104 form source/drain electrodes for the p and n type FETs.

An interlayer insulator 98 is formed over metal-1 polycide interconnection layer 100, 102 and 104. A metal-2 layer 110 includes a metal polycide and is formed on interlayer insulation 98. Conductivity between the metal-1 and metal-2 layers is provided through contact hole 112, the metal layers coming into contact at interface 114.

In a typical gate layout as shown in FIG. 8, a logic gate device comprises four adjacent basic cells. The cells include transistors formed in N diffusion region 116 and p diffusion region 117. Source/drain regions of the transistors are formed in the diffusion regions on opposite sides of polysilicon gate electrodes 120–126. Metal-1 routings 127 connect underlying substrate diffusion regions 116 and 117 and polysilicon gate electrodes 120–126, and overlying metal-2 routings 128.

As shown in FIG. 8, metal-2 output 128 from the logic gate device uses at least one of the four possible routing tracks. Thus, only 25% of the available metal-2 routing tracks are used. To increase decoder output line density to be equal to the density of the memory cell array, outputs must be provided along each metal-2 routing track of the decoder. That is, the pitch of the decoder output lines 128–134 must be equal to the pitch of the word lines of the associated memory cell array as shown in FIG. 9. However, since four basic cells are required per gate, the number of transistors required to implement such a decoder will not fit within a basic 256 cell bench without stacking multiple benches. If multiple benches are stacked, insufficient unused metal-2 routing remain to provide the required number of signal input lines to each logic device. The number of metal-1 routings available in each bench are also limited due to the requirements for intracell metal-1 connectivity. Therefore, alternate benches are dedicated to provide the additional metal-1 connectivity to the logic devices formed in adjacent benches. However, this results in decreased integration density.

Accordingly, an object of the invention is to provide a decoder structure compatible with dense memory cell array layout criteria in which 100% of all metal-2 routing tracks are utilized without sacrificing decoder integration density.

Another object of the invention is to make the inputs of all gates accessible without interfering with metal-2 tracks required by outputs from the decoder A still further object of the invention is to minimize the number of inputs provided to logic gates of a decoder within a critical area beneath a memory cell array.

DISCLOSURE OF THE INVENTION

According to one aspect of the invention, an address signal decoder provides decoded address signals to corresponding word lines in response to an address signal. The decoder includes pluralities of first and second subdecoder output lines arrayed in rows and columns to form a matrix. A column subdecoder receives a first portion of the address signal and supplies first subdecoded address signals to respective first subdecoder output lines. A row subdecoder receives a second portion of the address signal and supplies second subdecoder address signals to respective second subdecoder output lines. A plurality of first combinational logic elements are connected to corresponding first and second subdecoder output lines and respond to the first and second subdecoder address signals to supply decoded address signals to respective word lines. The first combinational logic elements are located at crossovers of the first and second subdecoder output lines.

According to one feature of the invention, the first combinational logic elements include circuitry for supplying logical sums of the first and second subdecoded address signals. In another aspect of the invention, the first combinational logic elements include circuitry for supplying logical products of the first and second subdecoded address signals According to another feature of the invention, driver circuits are provided wherein the first combinational logic elements supply the decoded address signals to the respective word lines through the driver circuits.

According to another aspect of the invention, the column subdecoder includes a plurality of second combinational logic circuits for receiving the first portion of the address signal and for supplying the first subdecoded signals to the first subdecoder output lines. The row subdecoder includes third combinational logic circuits for receiving the second portion of the address signal and, in response, supplying the second subdecoded address signal to the second subdecoder output lines.

According to a further feature of the invention, the first portion of the address signal includes a plurality of first bit signals wherein the second combinational logic circuits comprise logic circuits for supplying the logical products of the first bit signals. Similarly, the second portion of the address signal includes a plurality of second bit signals with the third combinational logic circuits including circuitry for supplying the logical products of the second bit signals. The first combinational logic elements include logic circuits for supplying the logical sums of the first and second subdecoded address signals. The circuitry for providing the logical products of the first and second bit signals may comprise NAND gates; logic for supplying the logical sum of the first and second subdecoded address signals may include OR gates.

In another embodiment of the invention, the second combinational logic circuits include logic circuitry to provide the logical sums of the first bit signals of the respective portions of the address signal. The first combinational logic elements comprise gates for supplying the logical products of the first and second subdecoded address signals. Summation of the first and second bit signals is performed by NOR gates and the logical product of the first and second subdecoded address signals is performed by NAND gates According to a still further feature of the invention, the first combinational logic elements include gates of a first logic type for supplying the decoded address signals. The column subdecoder includes first through fourth gates of a second logic type for receiving the first portion of the address signal and supplying the first subdecoded address signals to the first subdecoder output lines. A row subdecoder includes fifth through eighth gates of the second logic type for receiving the second portion of the address signal and supplying the second subdecoded address signal to the second subdecoder output lines The invention reduces the number of metal routing tracks in the high density region of a gate-array configured as a memory address signal decoder by positioning sub-function NAND gates outside the high density region. According to a preferred embodiment of the invention, an 8-to-256 decoder includes sixteen 4-to-16 output decoders. Each 4-to-16 decoder is divided into eight sub-functions having outputs ANDed together using a square array of OR gates. Thus, 4-input NAND gates are replaced by two, two-input sub-function NANDs feeding an OR gate. The two sub-function NANDs are positioned outside the high density region, whereas the OR gates reside within the region. The 16 OR gates are distributed in a 4×4 array format.

Each OR gate column is four basic cells in width, and there are four output lines for each column of OR gates to conform to dense layout criteria. The array structure therefore requires only one vertical input line per column and one horizontal input line per row to reach each OR gate. Inverter/drivers, used to complete the 4-to-16 output decoders, are arranged in a 4×4 array. Each inverter position corresponds to the OR gate that drives it.

A selected one of the sixteen 4-to-16 output decoders is enabled by a 17th 4-to-16 select decoder. The 4-to-16 select decoder receives the four most significant address signal bits of the 8 bit address signal and decodes the 4 bits to provide an enable signal on one of 16 enable lines. The enable lines activate respective ones of the sixteen 4-to-16 output decoders to control consecutive blocks of sixteen output lines. Each of the 4-to-16 output decoders supplies output signals in every available metal-2 output signal line. Each 4-to-16 decoder is supplied with sub-function input signals along orthogonal metal-1 and metal-2 routing pads.

The above and still further objects, features and advantages of the present invention will become apparent upon consideration of the following detailed description of several specific embodiments thereof, especially when taken in conjunction with the accompanying drawings.

BRIEF DESCRIPTION OF DRAWINGS

FIG. 12 is a table of subdecoder sub-functions.

FIG. 13 is a table of extracted sub-functions according to the table of FIG. 12.

FIG. 14 is a logic table layout of a 4×4 subdecoder implementing the sub-functions given in the table of FIG. 11.

FIG. 15 is a table showing alternative gate array sub-functions.

FIG. 16 is a table of extracted sub-functions according to the table of FIG. 15.

BEST MODE FOR CARRYING OUT THE INVENTION

Figure 1:
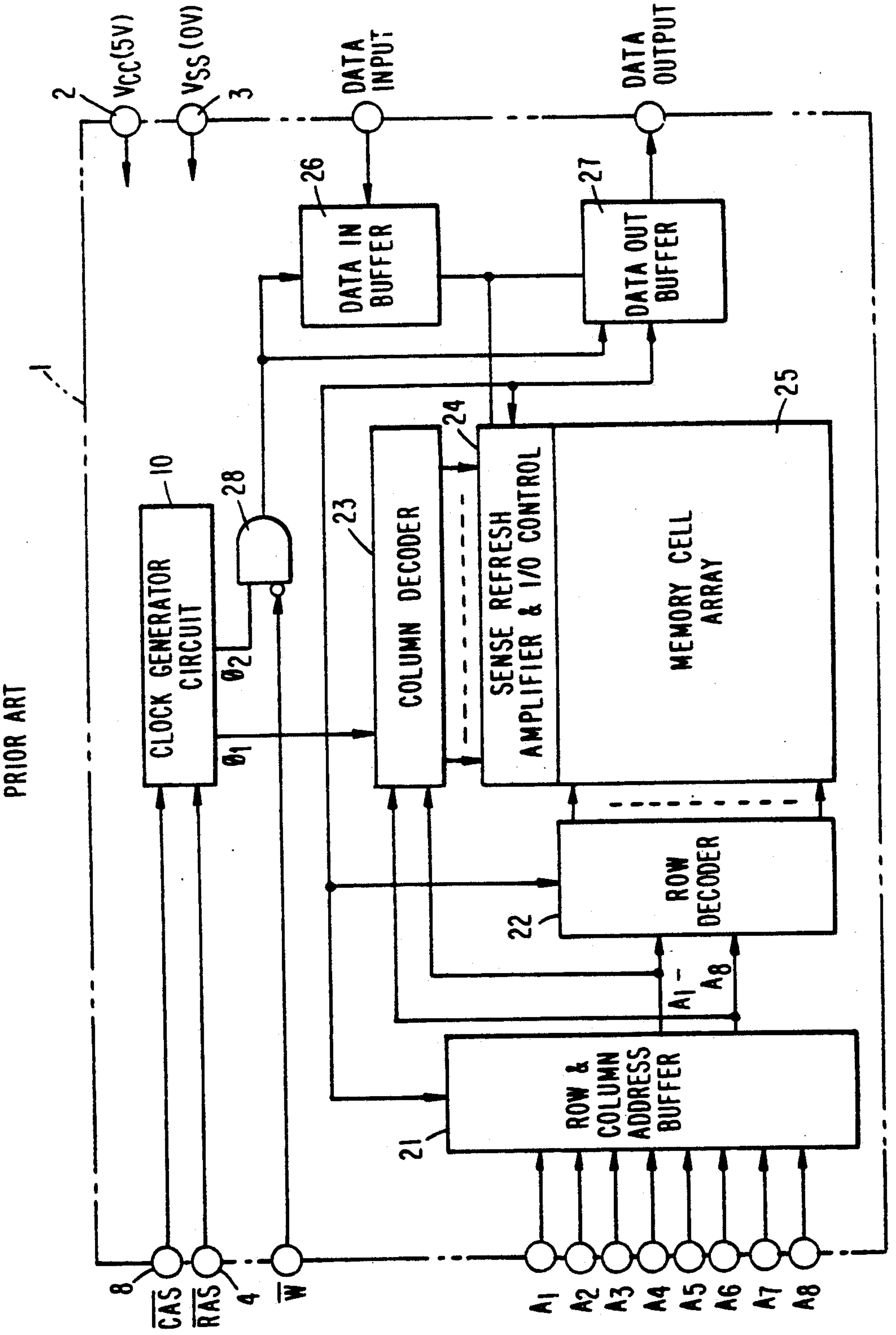
FIG. 1 is block diagram of a simplified circuit of a conventional DRAM.
Figure 2:
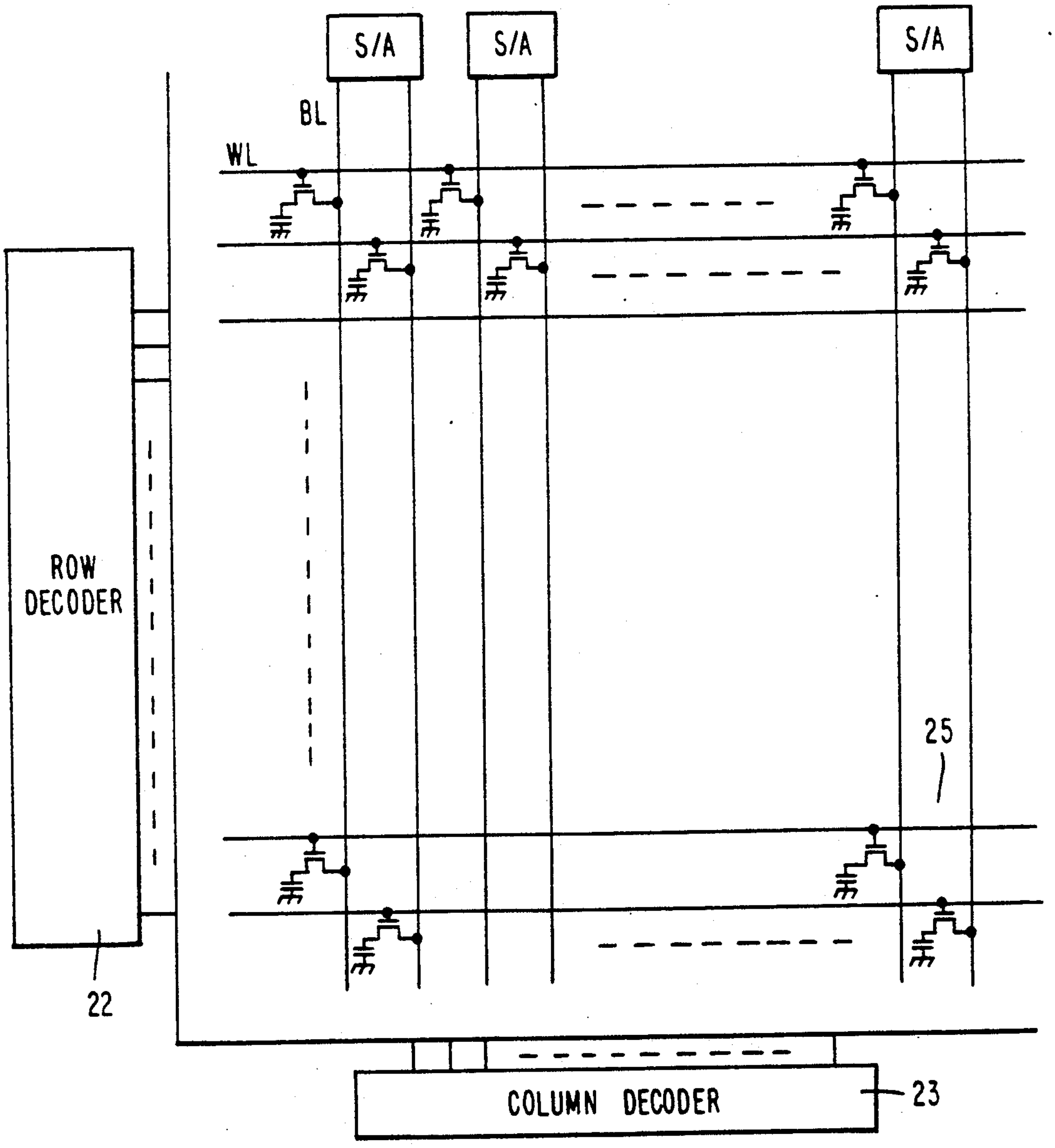
FIG. 2 is a block diagram showing the memory cell array of the DRAM of FIG. 1.
Figure 3:
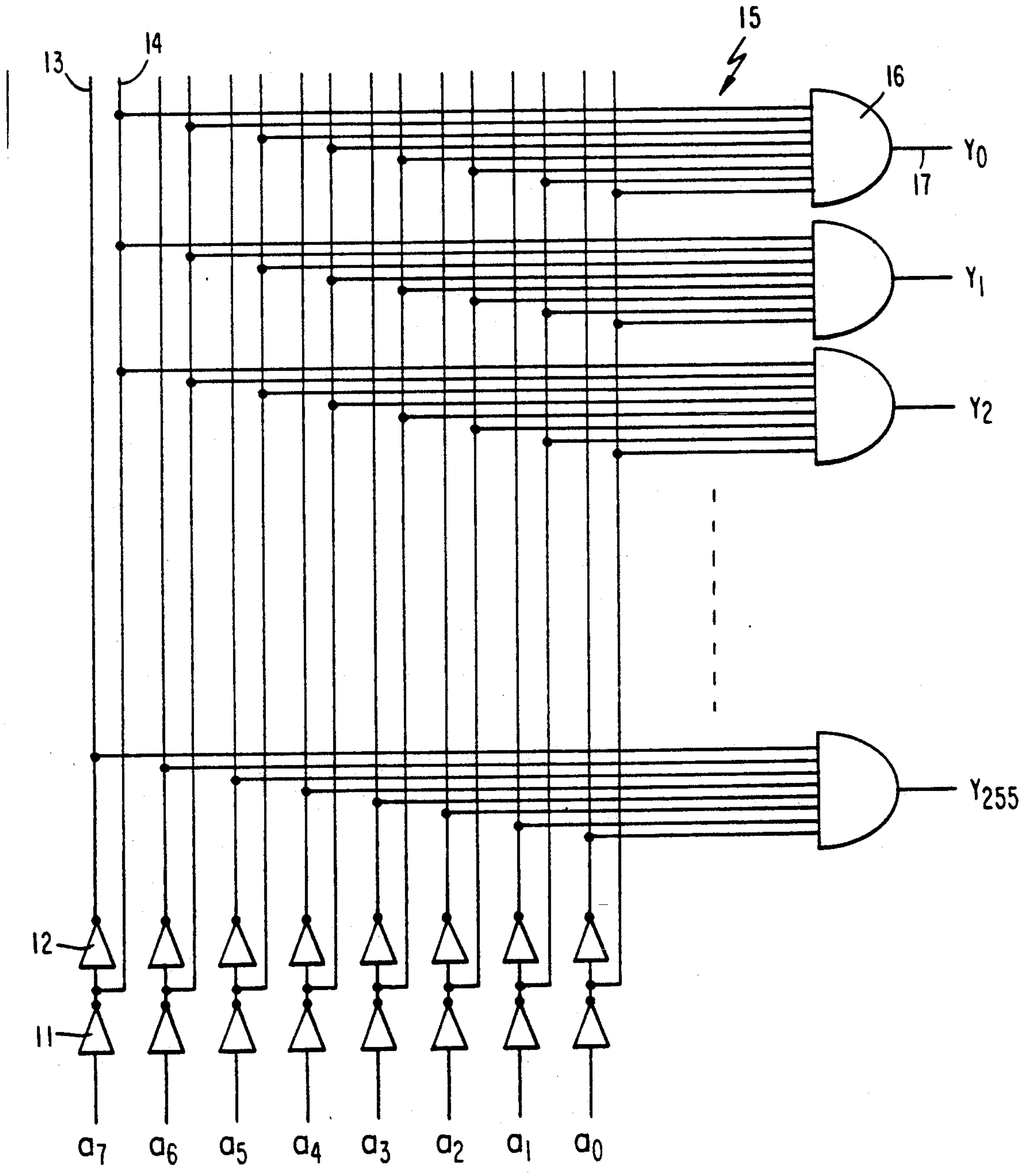
FIG. 3 is a schematic diagram of a conventional rectangular decoder.
Figure 4:
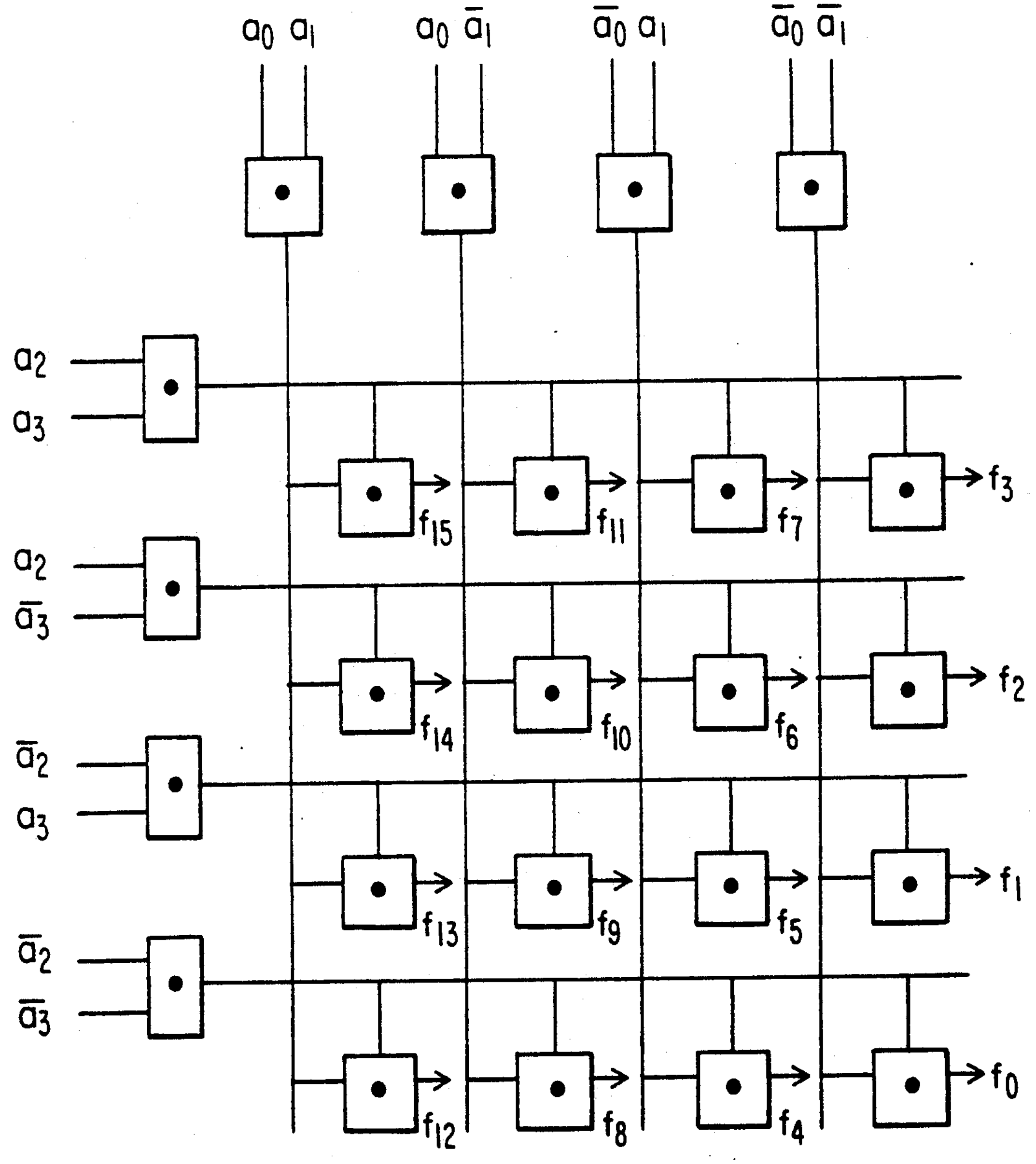
FIG. 4 is a block diagram of a subdecoder of a dual-tree, address signal decoder.
Figure 5:
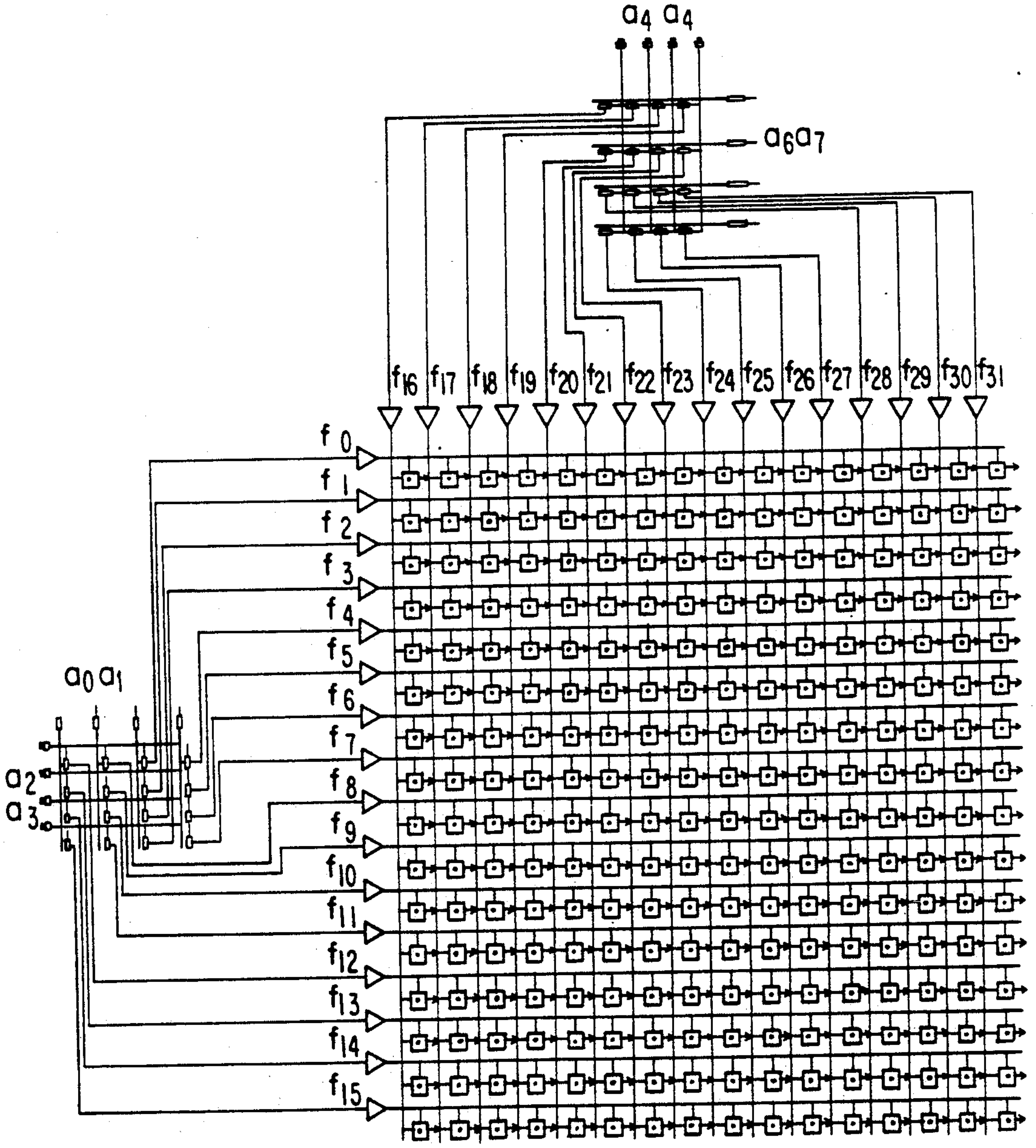
FIG. 5 is a block diagram of an 8-to-256 dual-tree decoder.
Figure 6:
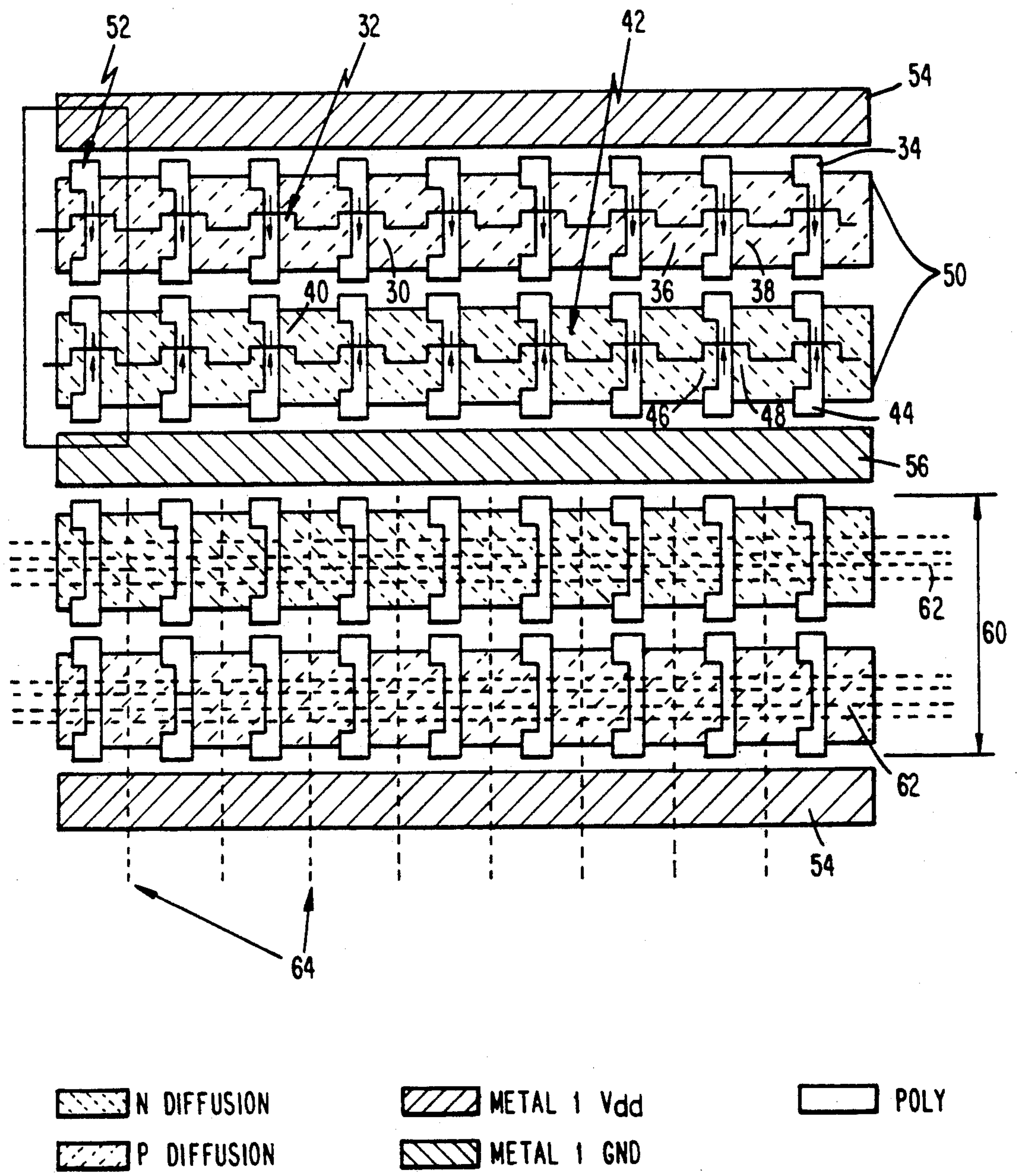
FIG. 6 is a diagram of a basic gate-array using CMOS technology.
Figure 7:
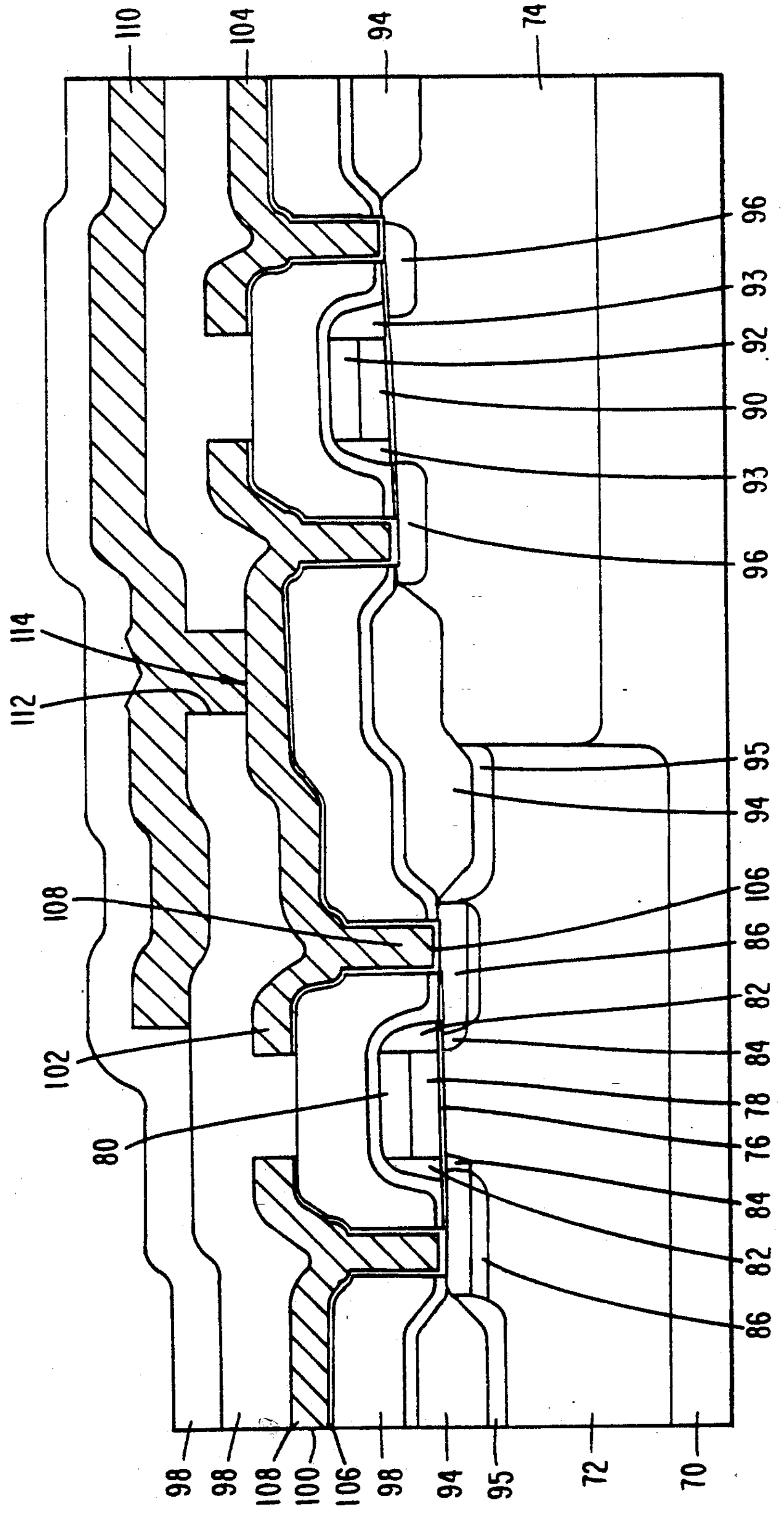
FIG. 7 is a cross-sectional view of a CMOS gate array.
Figure 8:
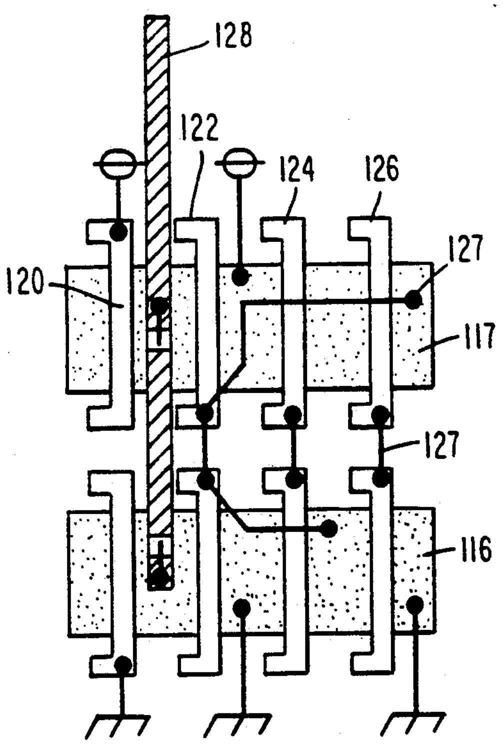
FIG. 8 is a plan view of a typical gate layout showing normal density of metal-2 channels.
Figure 9:
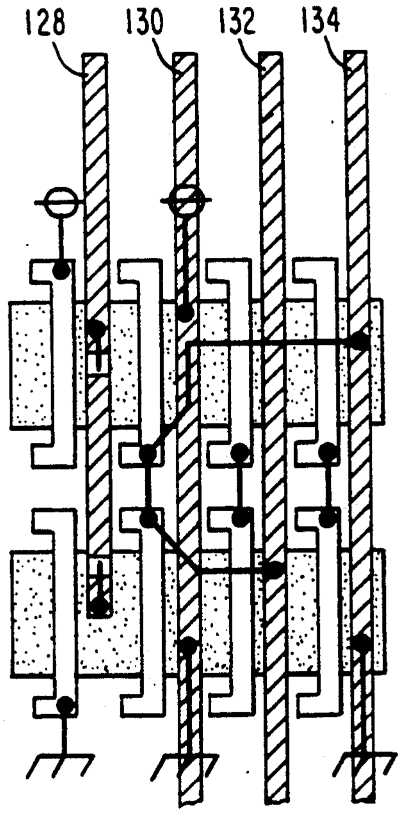
FIG. 9 is a plan view of a gate layout showing 100% metal-2 routing density.
Figure 10:
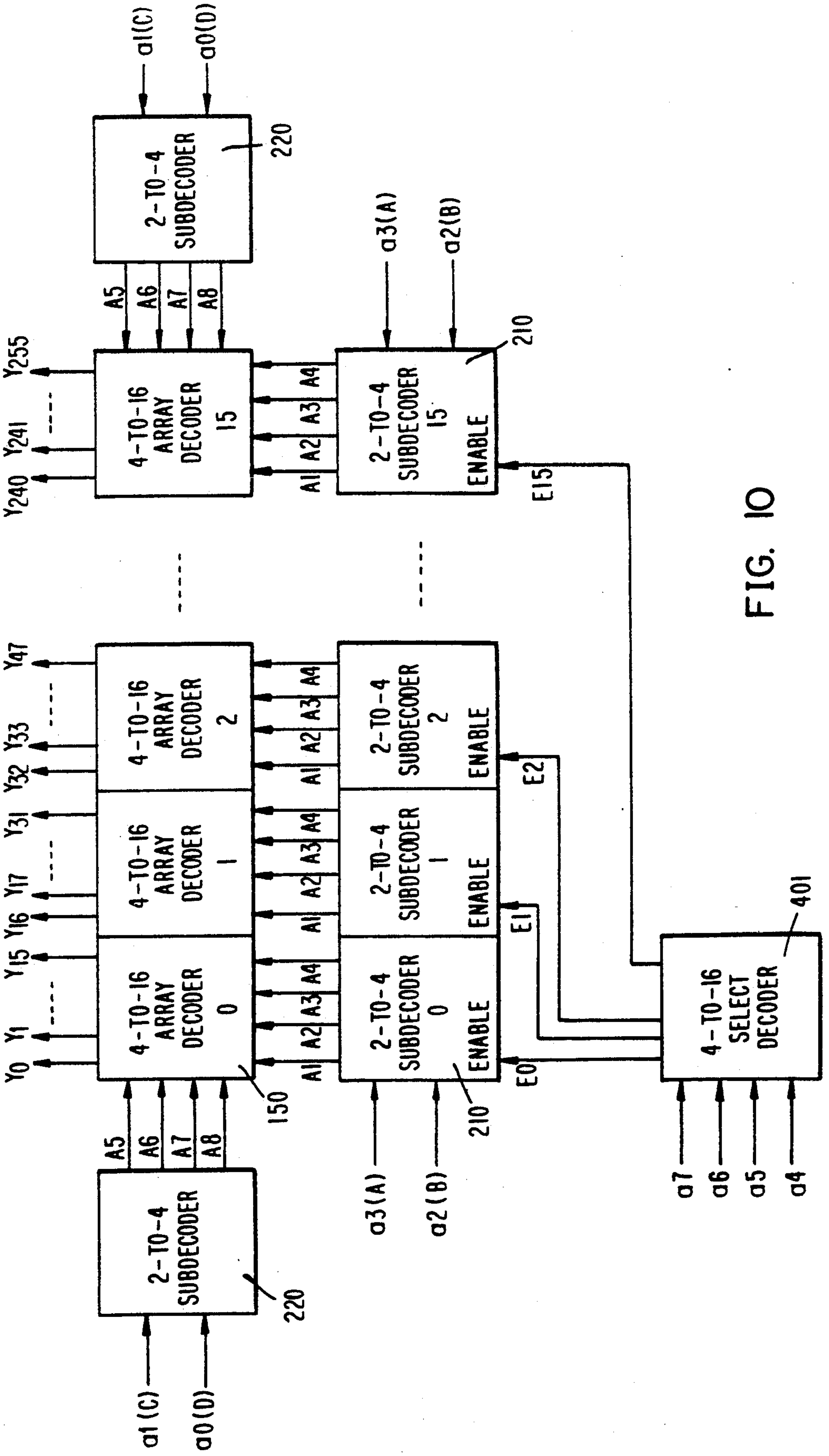
FIG. 10 is a block diagram of an address signal decoder according to the invention.

A block diagram of an address signal decoder according to the invention is shown in FIG. 10. The most significant four bits of an address signal a7–a0 are applied to a 4-to-16 select decoder 401 to selectively enable one of sixteen 4-to-16 decoders 150. The least significant four bits of the address signal are applied in pairs to subdecoders 210 and 220. Subdecoders 210 and 220 form the products of the applied bit pair to generate sub-function signals A1–A4 and A5–A8, respectively.

The sub-function signals A–A4 and A5–A8 are supplied to 4-to-16 array decoders 150 and, in response, a decoded address signal is generated on one of its sixteen output lines.

Figure 11:
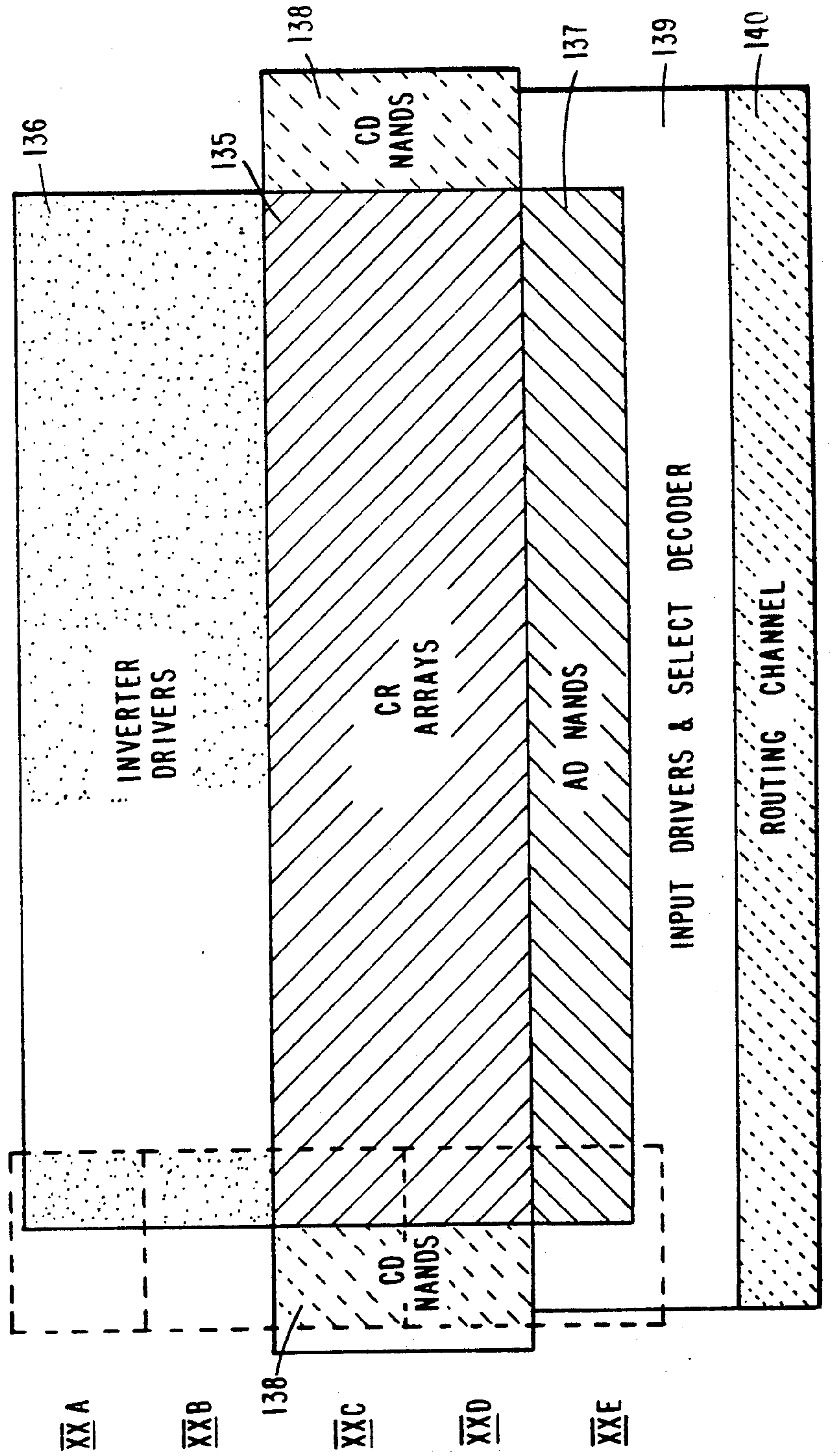
FIG. 11 is a decoder floor plan of an address signal decoder according to the invention.

FIG. 11 is a decoder floor plan of an address signal decoder. The areas within the dashed lines are shown in greater detail in FIGS. 20A–20E. Sub-function NANDs forming the select decoder and subdecoder are positioned outside the high density region 135, whereas the OR gates forming the array decoders reside within the region. Each group of sixteen OR gates is distributed in a 4×4 array format.

Input drivers for the subdecoder NAND gates and the 4-to-16 select decoder are formed in area 139. The input drivers buffer the address signal and supply the buffered address signal to the subdecoder NAND gates formed in areas 137 and 138. The select decoder receives the four most significant bits of the address signal to enable the corresponding one of sixteen array decoders in area 135. Address signal routing to the drivers and select decoder is supplied through a dedicated routing channel 140.

To minimize the number of metal routing channels required, each OR gate of OR gate array 135 requires only two input terminals. Decoding of the four bit address signal is accomplished by subdecoding to provide two sets of four sub-function signals which are supplied in pairs to respective OR gates.

In a preferred implementation, a four bit address signal is subdivided into pairs of product terms as shown in the table of FIG. 12. Eight two-input NAND gates generate the sub-function outputs shown in the table of FIG. 13 by decoding the four address signal bits in groups of two bits. The two most significant bits, i.e., A and B, are supplied to a first 2-to-4 rectangular decoder formed by four "AB NANDS". Similarly, the two least significant address signal bits are supplied to a second subdecoder comprising "CD NANDS". The output signals A1–A4 from the "AB NANDS" and output signals A5–A8 from "CD NANDS" are supplied to the array decoders comprised of sixteen 4×4 arrays of OR gates. The sixteen address signals generated by each 4×4 decoder are formed by the logical sum of eight sub-functions shown in the table of FIG. 14. The product of sub-functions A1–A4 and A5–A8 is formed by applying the sub-functions to OR gates configured in a square array; the product terms of the sub-functions represent the decoded address signal.

Although one embodiment of the invention utilizes NAND gates to produce sub-functions that are combined in a high density array of OR gates, other combinations of logic gate types are possible. For example, referring to the tables of FIGS. 15 and 16, a four-input sixteen-output decoder can be broken down into eight sub-functions derived by producing the logical sums of the applied address signals using NOR gates. The sub-functions can then be combined by forming the logical product using an array of NAND gates.

Figure 17:
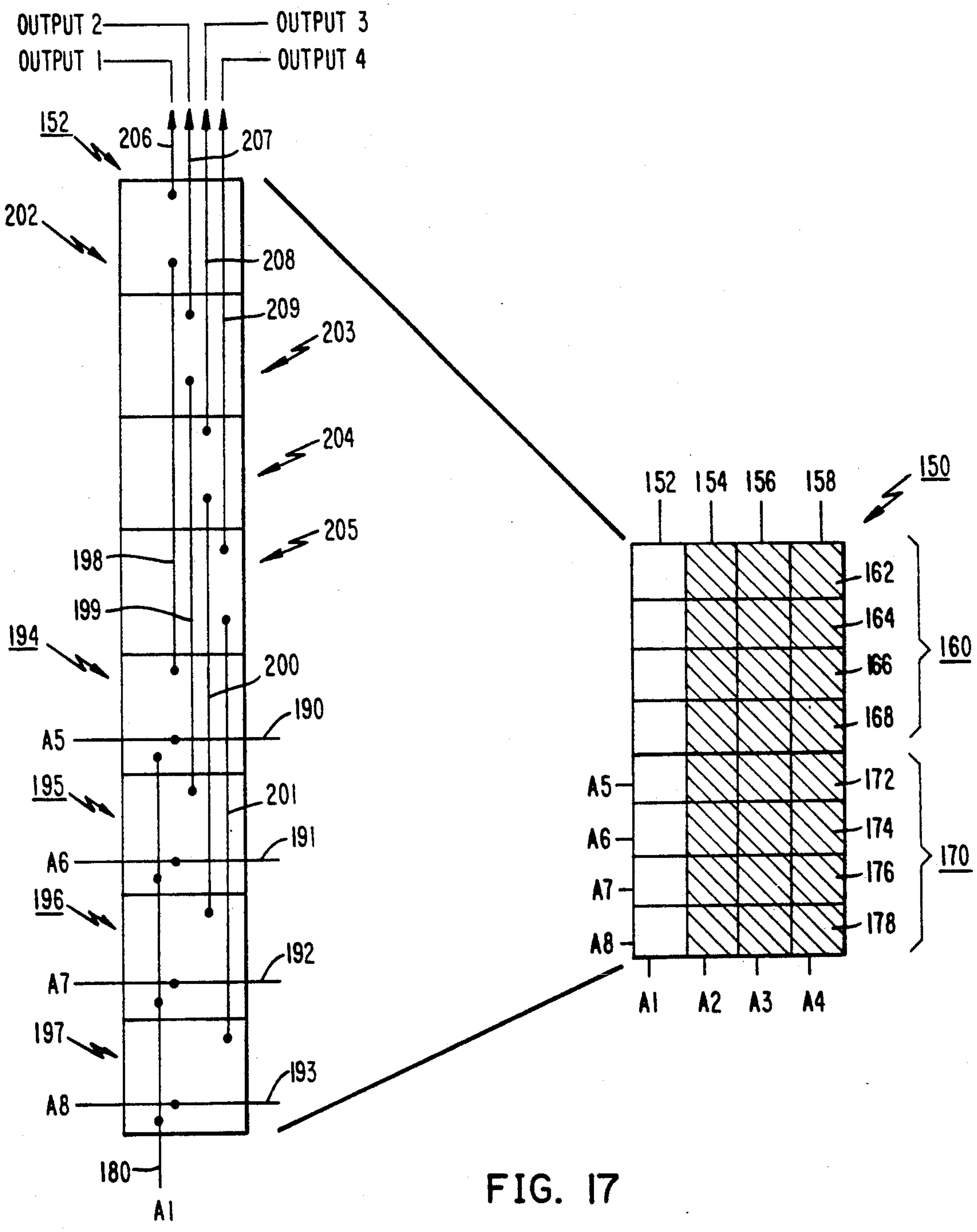
FIG. 17 is a partial diagram of an output decoder having a maximized output line density.

Each 4-to-16 decoder is formed by four identical array columns as shown in FIG. 17. Decoder block 150 includes a driver array 160 and an OR gate array 170. Sub-functions A1–A4 and A5–A8 are supplied by peripheral subdecoder NAND gates not shown. Each array column 152–158 is structurally identical; only first array column 152 is shown in detail.

Each functional block 194–197 includes a two input OR gate. Blocks 202–205 each include an inverter driver receiving an output from a corresponding OR gate. A first sub-function signal A1 is provided in parallel to the OR gates of blocks 194–197 via column subdecoder output line 180. Sub-functions A5–A8 are provided via first-fourth row subdecoder output lines 190–193 to the OR gates in respective rows.

Outputs from OR gates are provided via OR output lines 198–201 to inverter drivers located in blocks 202–205. The outputs from the inverter drivers are provided via output lines 206–209 to corresponding word lines of a memory cell array.

Figure 18:
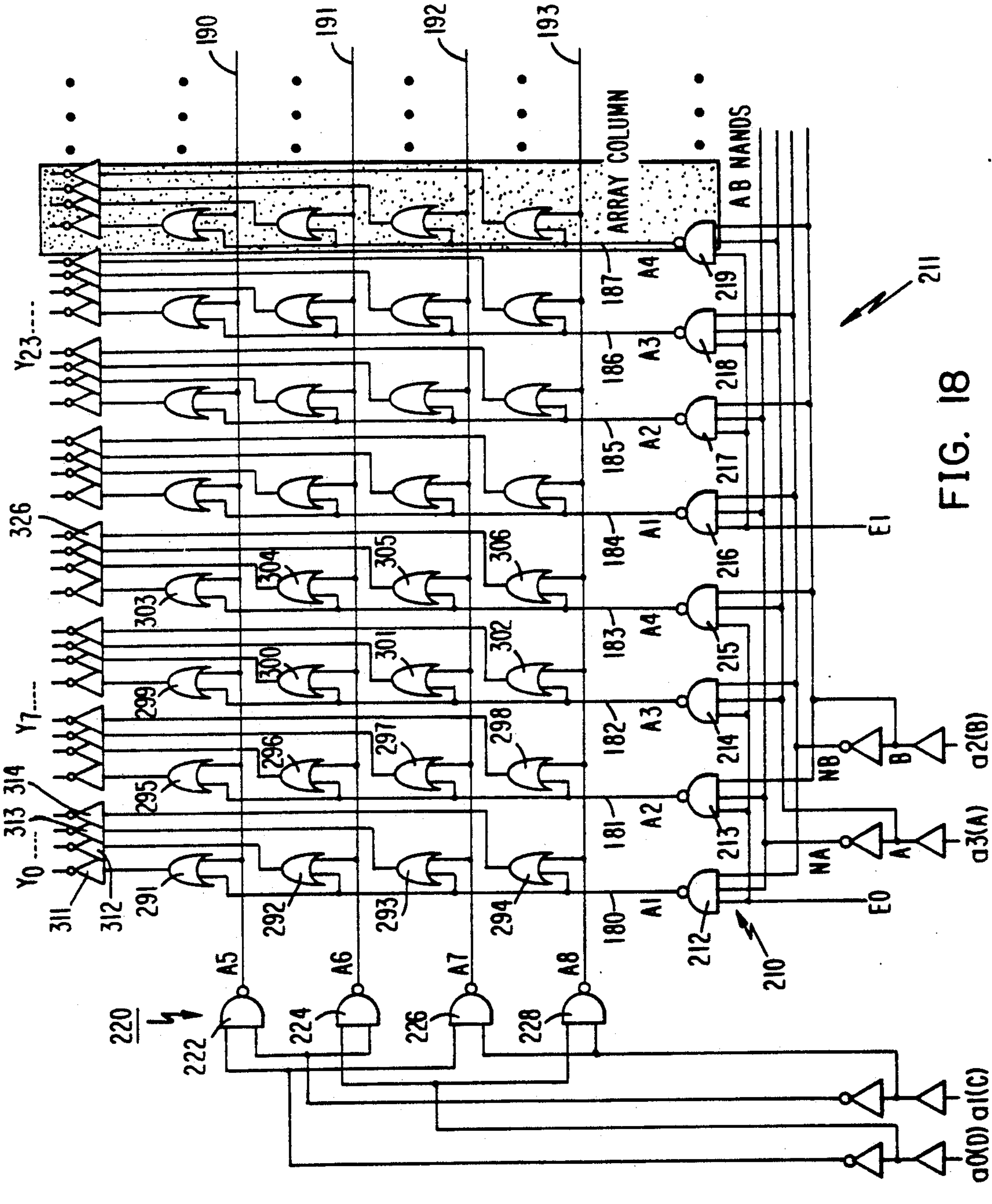
FIG. 18 is a partial schematic diagram of a decoder according to the invention.

A partial schematic diagram showing the first two of sixteen 4-to-16 decoders is presented in FIG. 18. A first array of OR circuits include OR gates 291–306. The first array is enabled by an enable signal EO applied to gates 212–215 of column subdecoder 210. Subfunction signals A1–A4 from column subdecoder 210 are provided by first-fourth array column NAND gates 212–215 to OR gates in each column via first-fourth column subdecoder output lines 190–183. Sub-functions A5–A8 generated by NAND gates 222–228 of column subdecoder 220 are provided to respective first-fourth subdecoder output lines 190–193. Each OR gate 291–306 receives one of the sub-function signals A1–A4 and one of the sub-function signals A5–A8 and, in response, supplies the logical sum thereof to corresponding inverter drivers 311–326 as output signals Y0–Y15.

Figure 19:
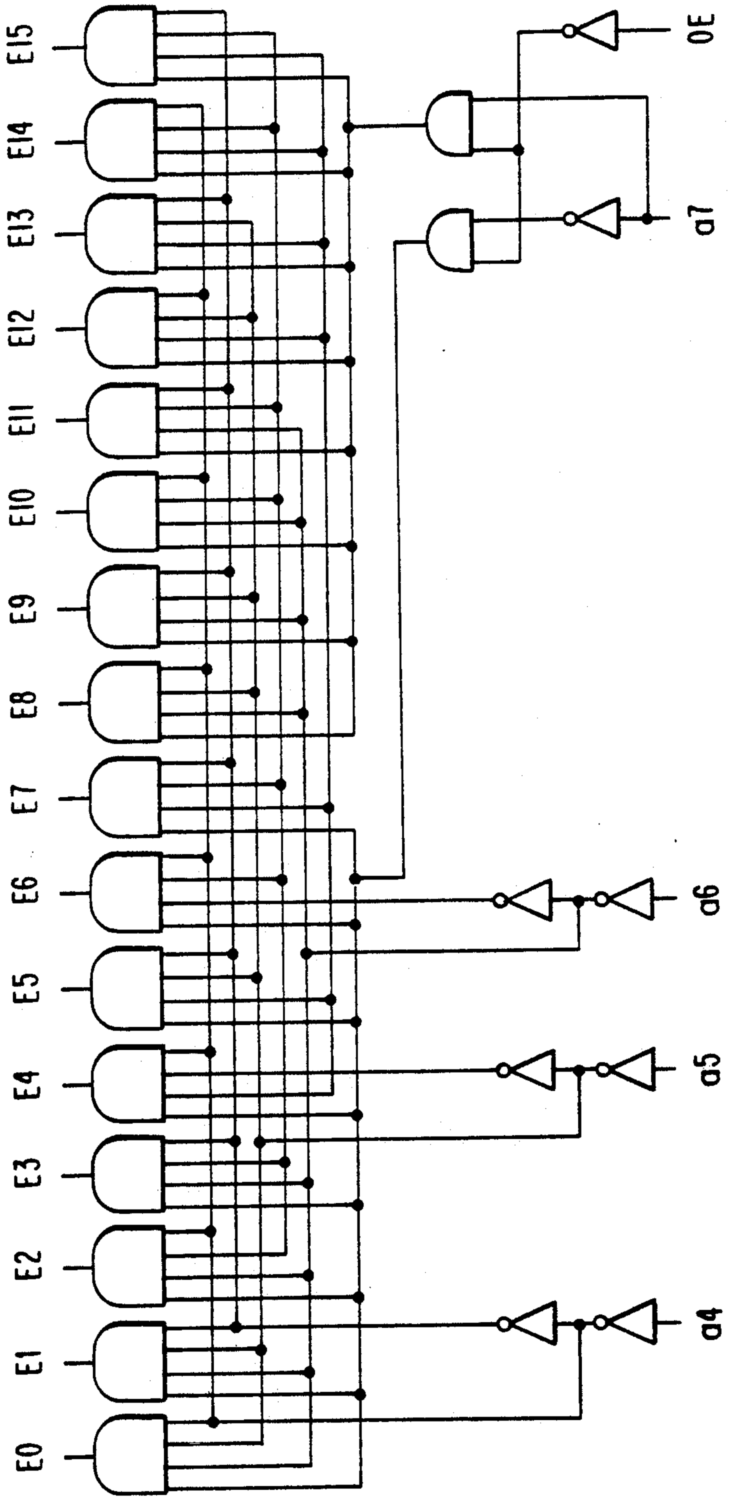
FIG. 19 is a schematic diagram of a select decoder for enabling one of the sixteen 4-to-16 decoders according to the invention.

An enable decoder circuit for generating enable signals E0–E15 is shown in FIG. 19. High order address signal bits a4–a7 are supplied to a rectangular select decoder. The select decoder includes sixteen four input AND gates which supply enable signals E0–E15 to enable respective array column decoders.

Figure 20:
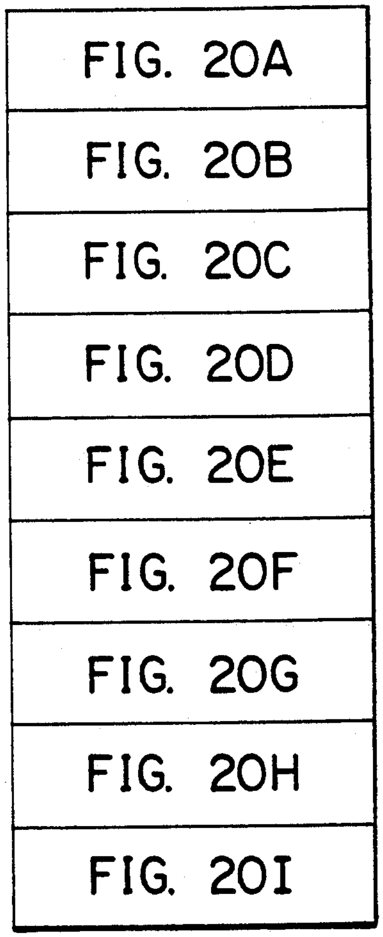
FIGS. 20A–20I are diagrams of a substrate layout for implementing a 4-to-16 output decoder according to the invention.
Figure 20A:
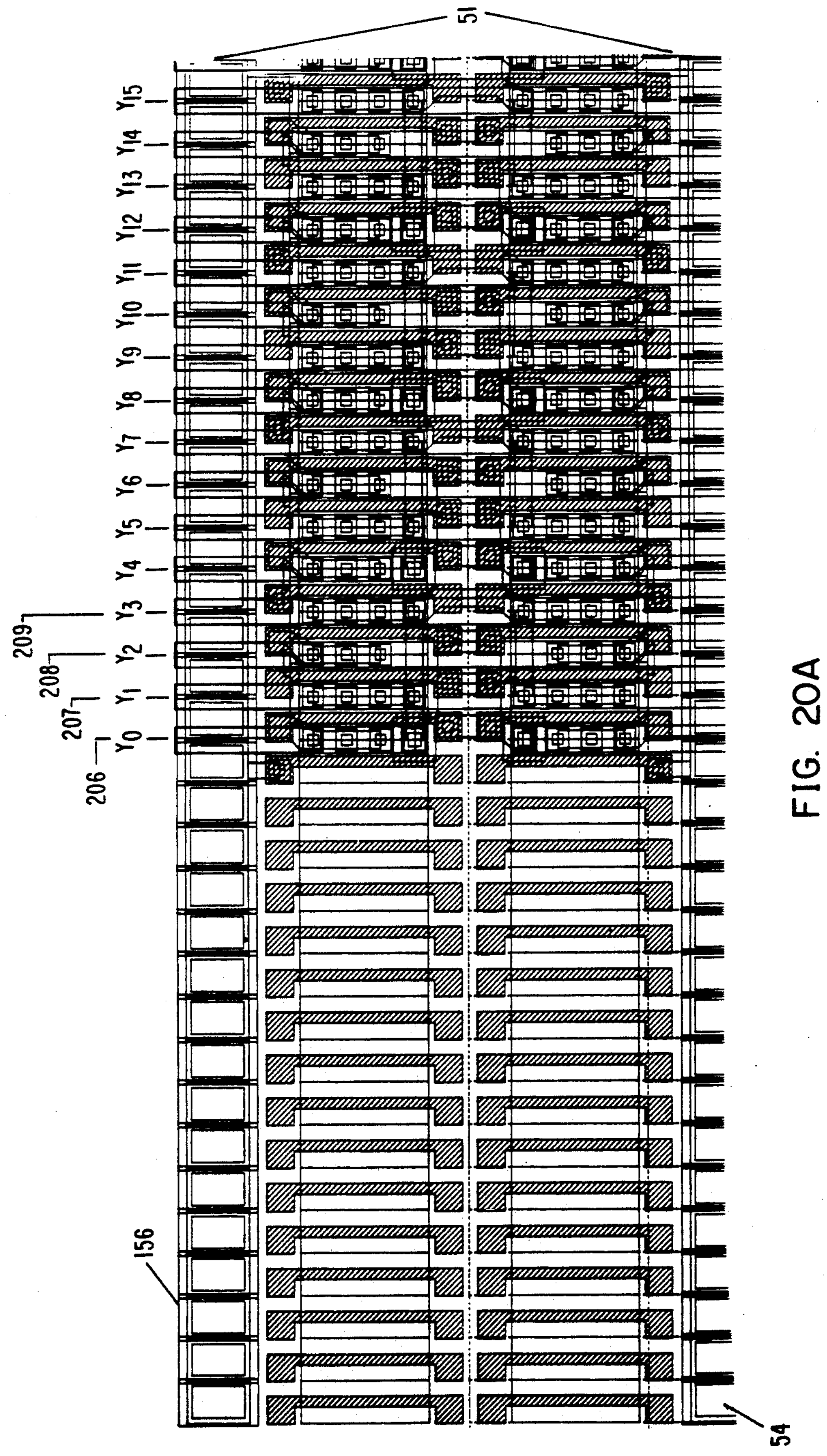
Figure 20B:
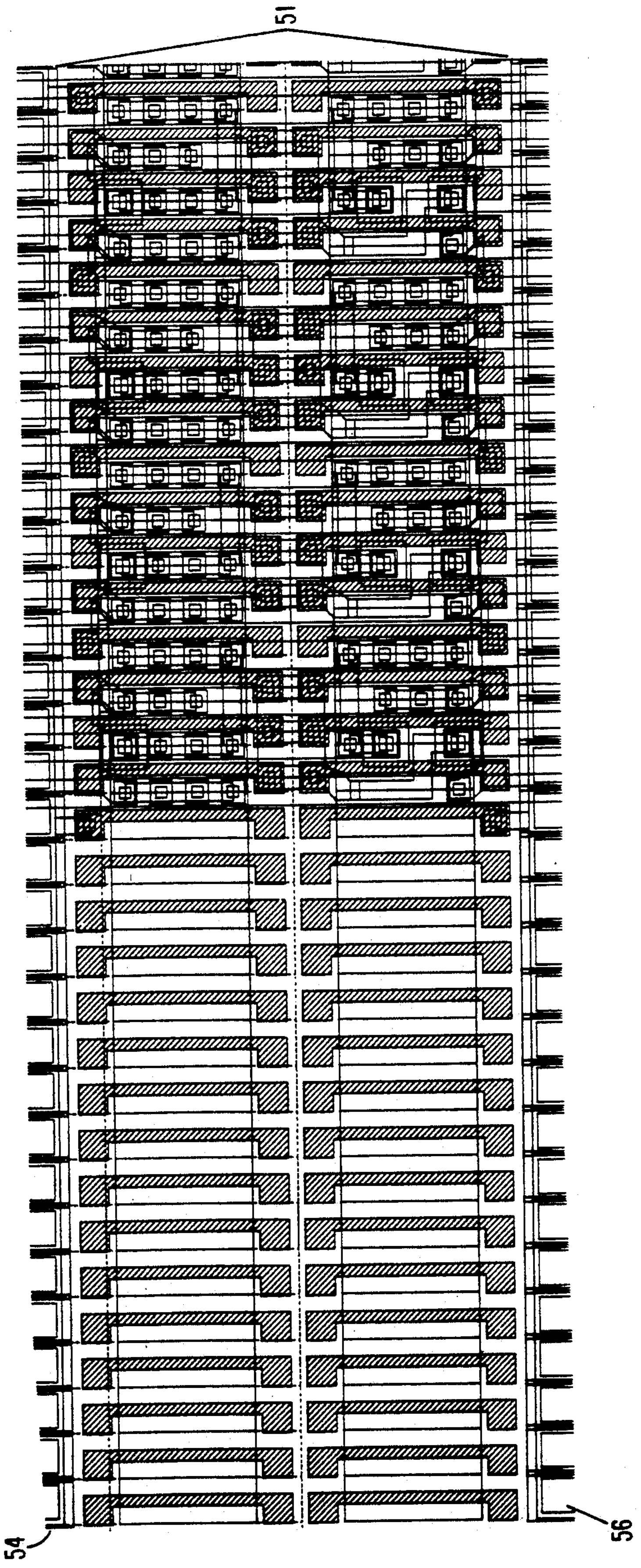
Figure 20C:
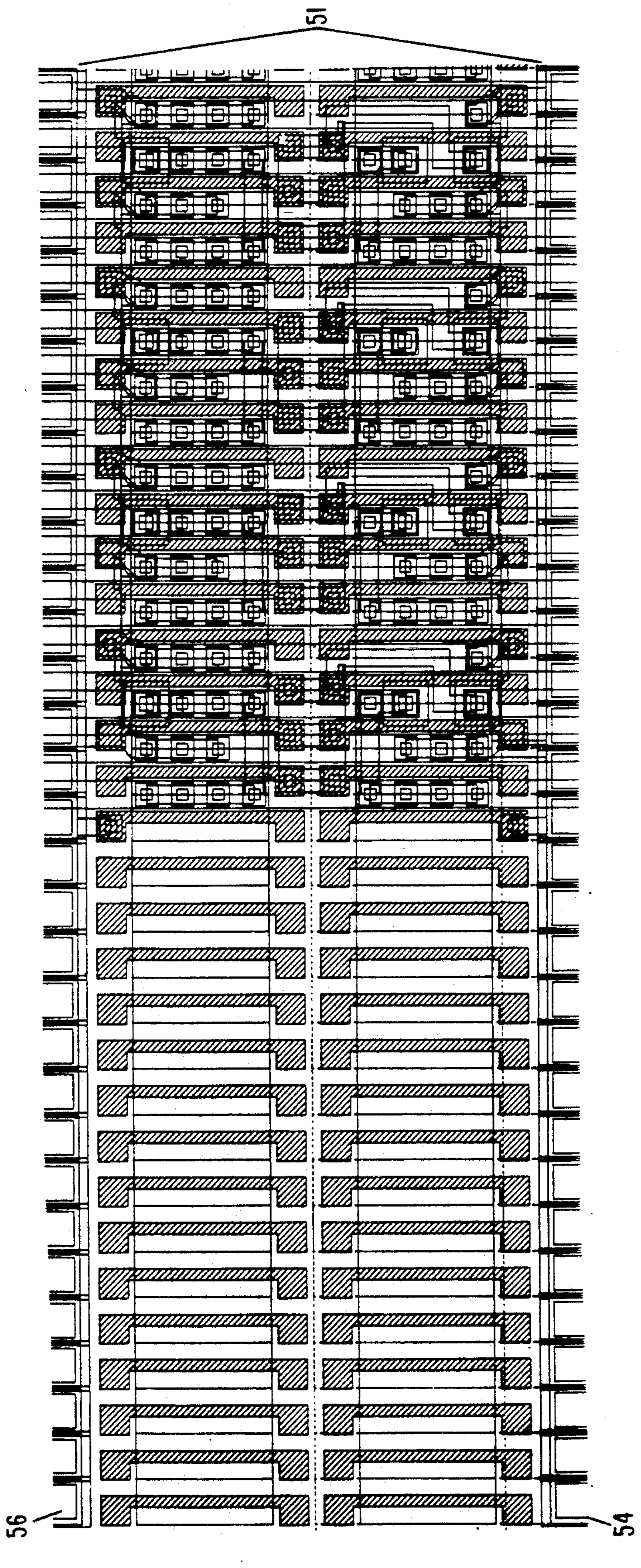
Figure 20D:
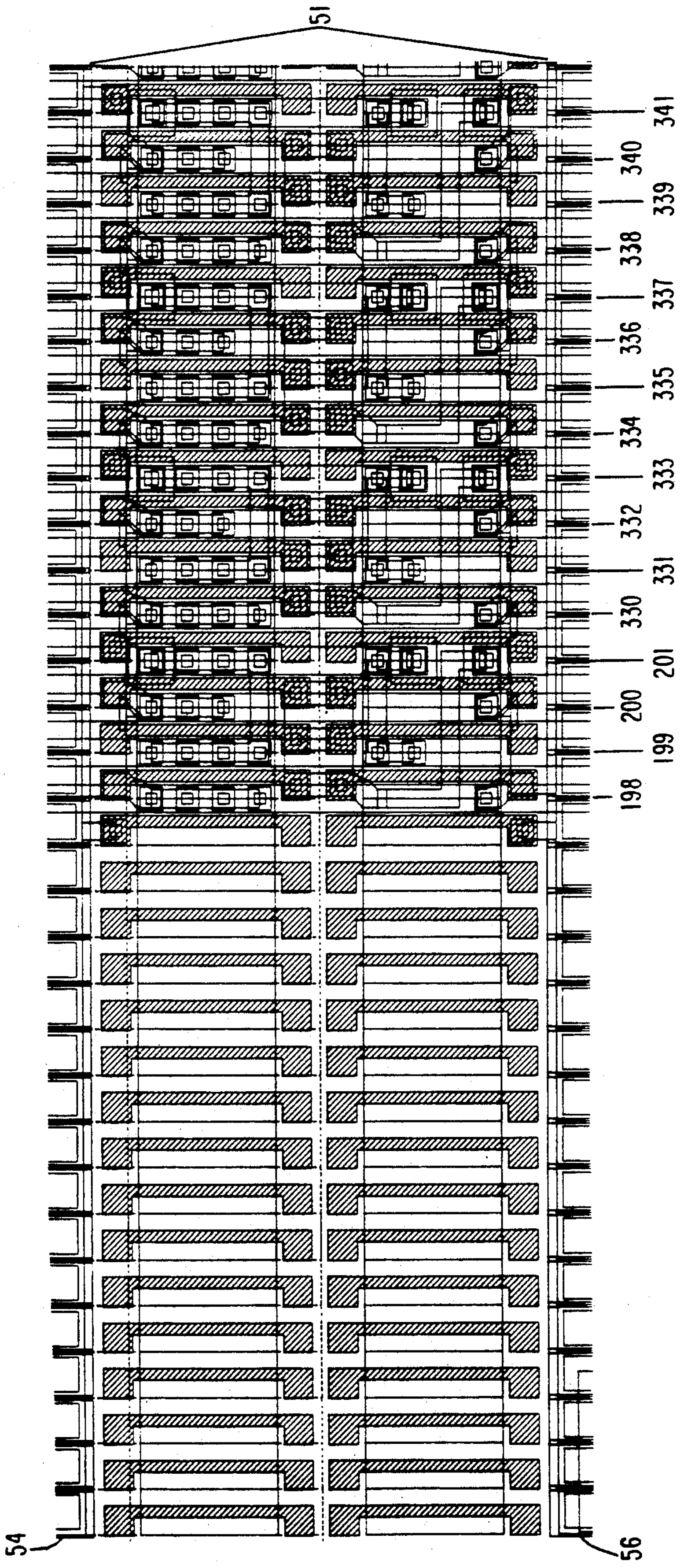
Figure 20E:
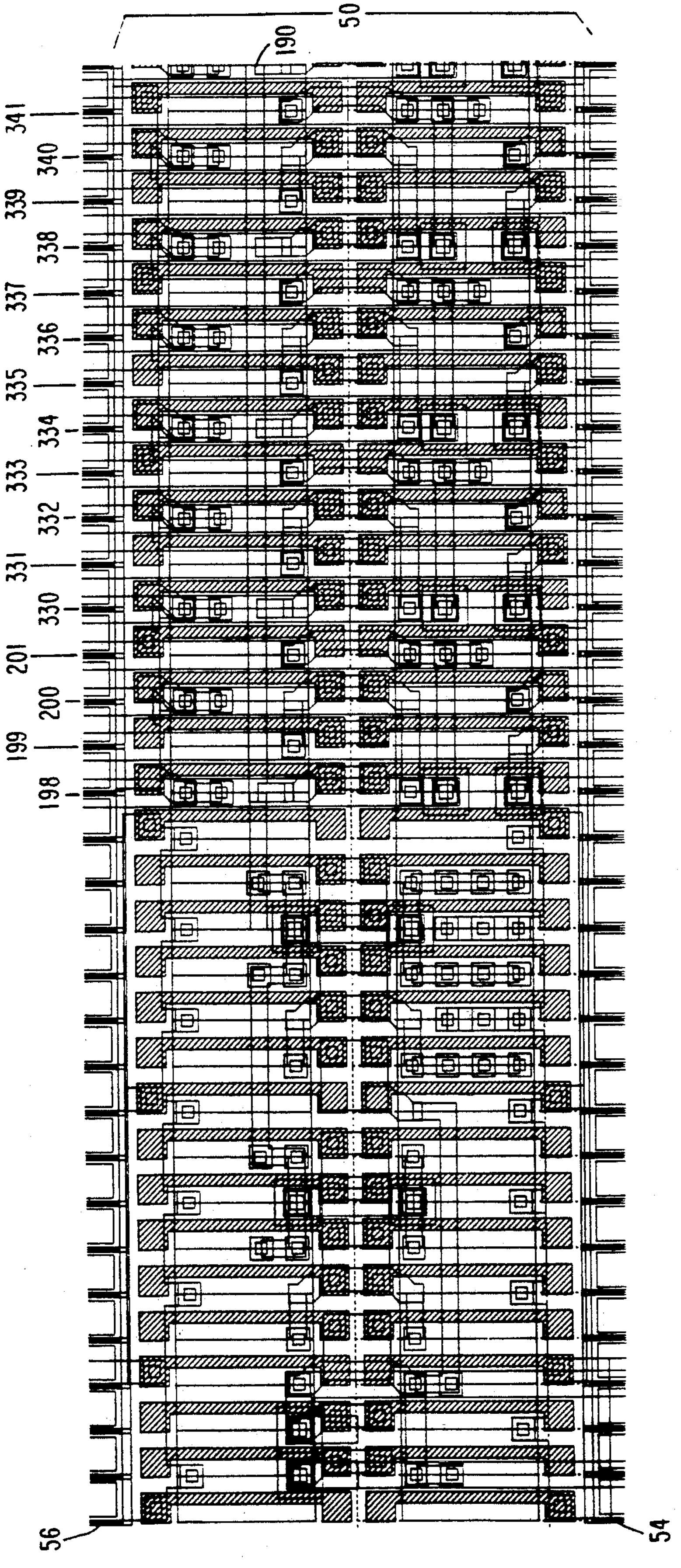
Figure 20F:
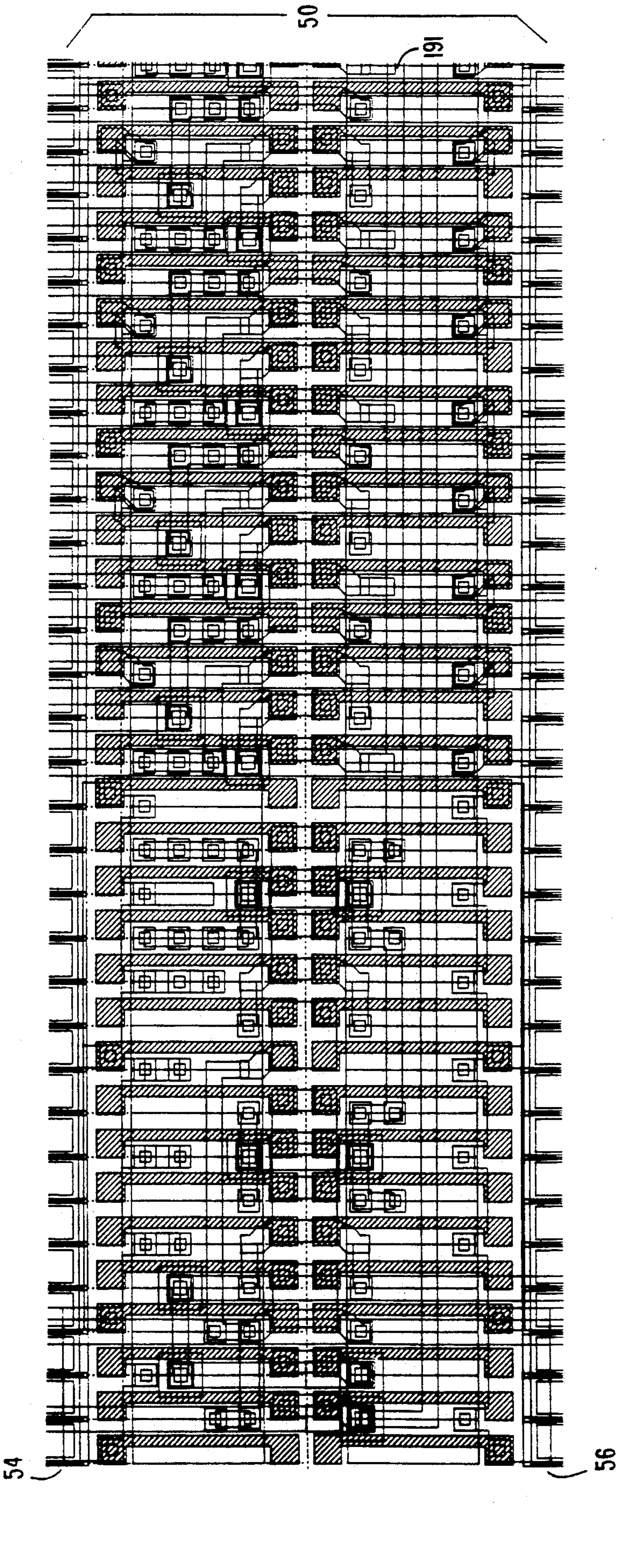
Figure 20G:
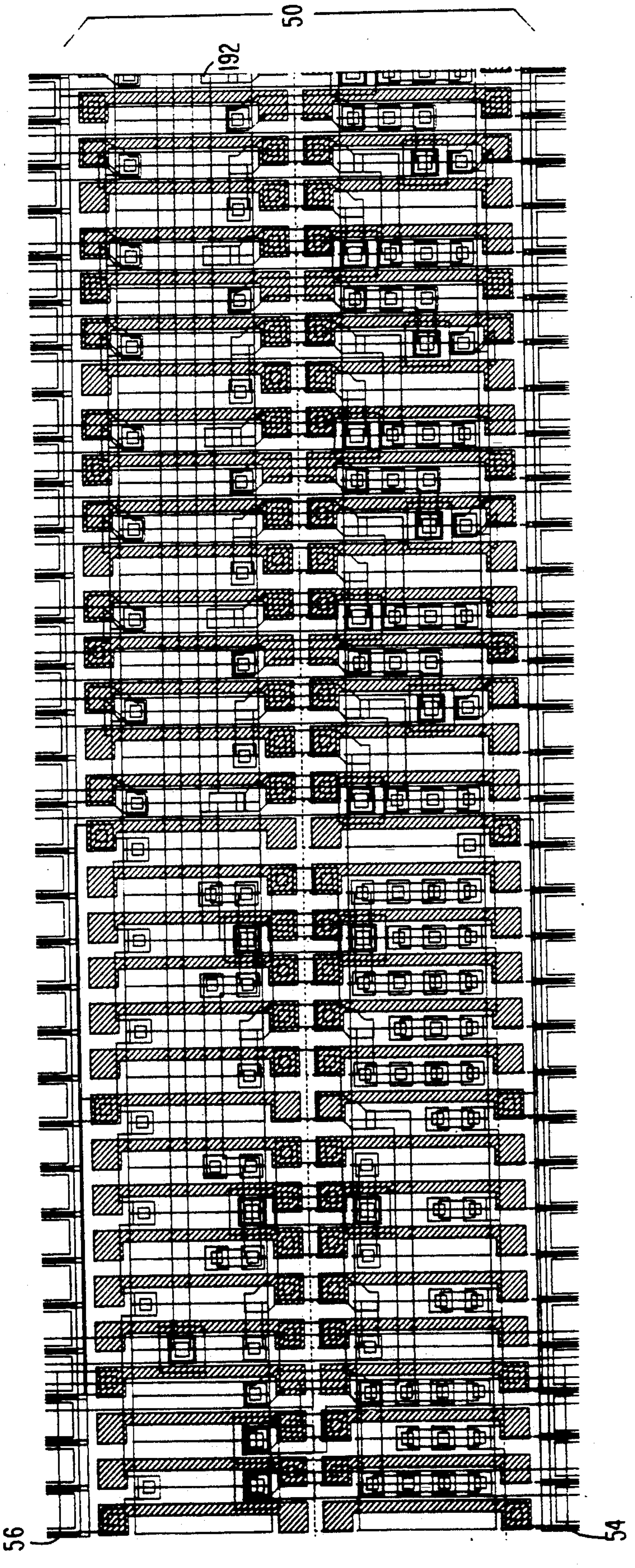
Figure 20H:
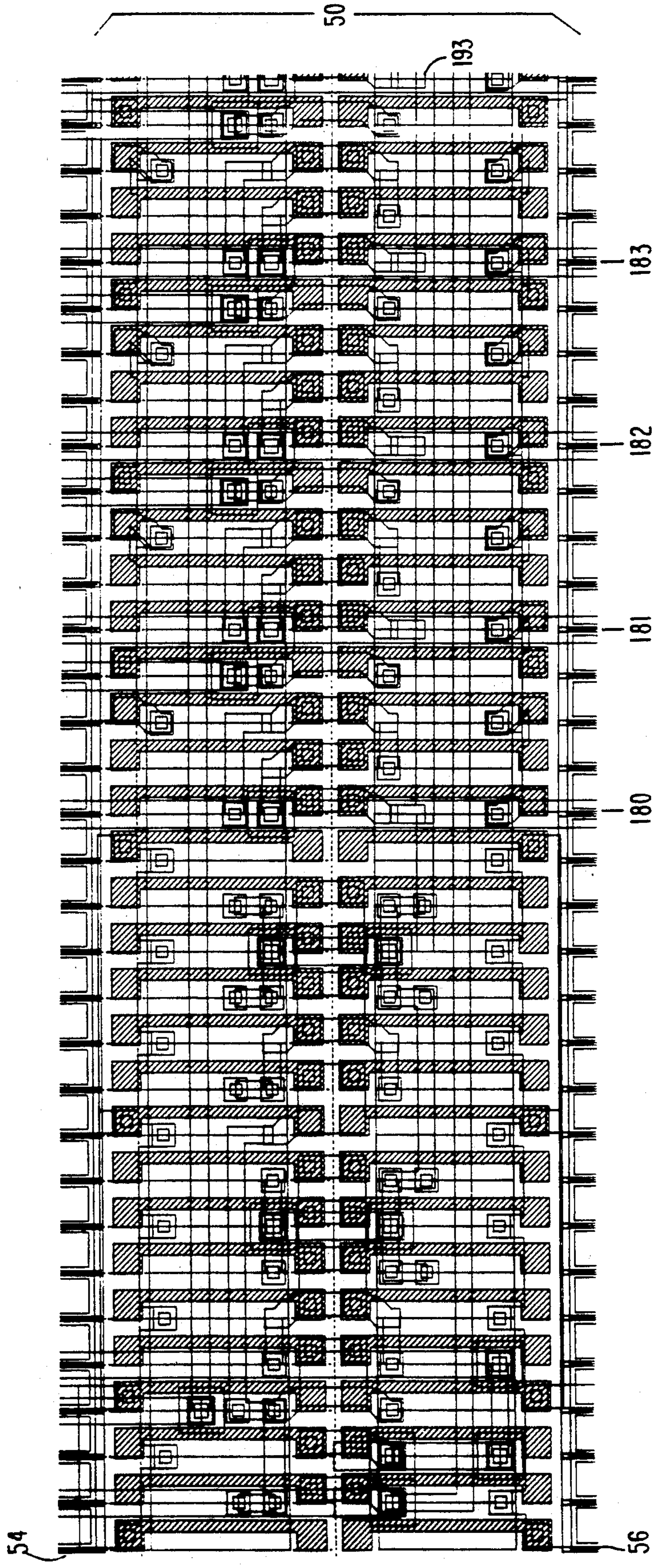
Figure 20I:
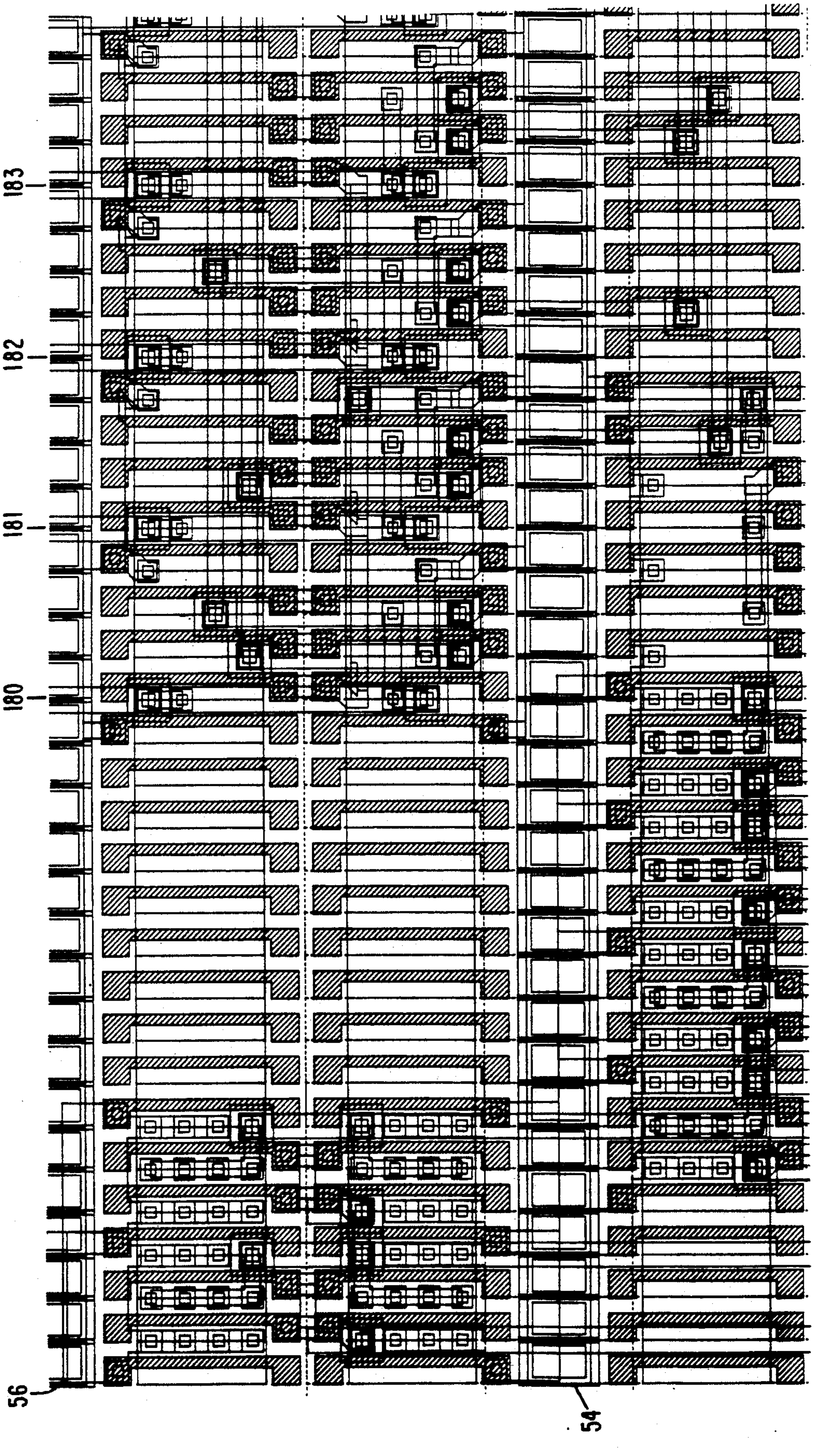

A diagram of a substrate layout for implementing one of the 4-to-16 output decoders is shown in FIGS. 20A–20E. FIGS. 20A and 20B each show layouts for two benches of four inverter driver circuits corresponding to functional blocks 202–205 of FIG. 17. FIGS. 20C and 20D provide layout detail including functional blocks 194–197 (FIG. 17), each figure including two benches of four OR gates. FIG. 20E is a partial substrate layout diagram of a bench of input driver and select decoder circuits. FIGS. 20A–20E are arranged as shown in the drawings to illustrate in detail a complete 4-to-16 decoder with associated inverter drivers. Thus, the complete 4-to-16 decoder includes four stacked OR gate benches 50 and four stacked inverter/driver benches 51; each bench includes 16 basic cells.

Each basic cell includes a p and n type transistor. Four adjacent basic cells are connected by a metal-1 layer, depicted by hatching having a positive slope, to form respective OR gates. Metal-2 routing layers, including first-fourth column subdecoder output lines 180–183 and first-fourth array column OR gate output lines 198–201 and 330–341, are represented by areas having hatching with a negative slope. A metal-1 routing layer is used to form $V_{cc}$ buses 54 and $V_{ss}$ buses 56 and is used for internal wiring for each basic cell to form OR gates.

By stacking four benches 50, metal-2 routing tracks 180–183 are used to supply sub-function signals A1–A4 to each of the OR gates. Extended portions 198–201 and 330–341 of the metal-2 routing tracks provide the outputs from the OR gates to the inverter driver array formed by benches 51.

Sub-function signals A5–A8 are provided to the OR gates by first-fourth row subdecoder output lines 190–193 formed by the metal-1 routing layer. The sub-function signals supplied along respective first row subdecoder output lines 190–193 are common to all the OR gates located along a particular bench so that only one metal-1 routing channel per bench is required. Remaining metal-1 routing tracks are used for internal gate wiring.

As shown in FIGS. 20C and 20D, four benches of OR gates are stacked to achieve the required 100% metal-2 utilization density. Outputs from the OR gates are supplied to output lines 198–201 and 330–341, the output lines having a pitch equal to the spacing of the basic cells. Thus, the required output density compatible with the memory cell array is achieved.

Figure 21:
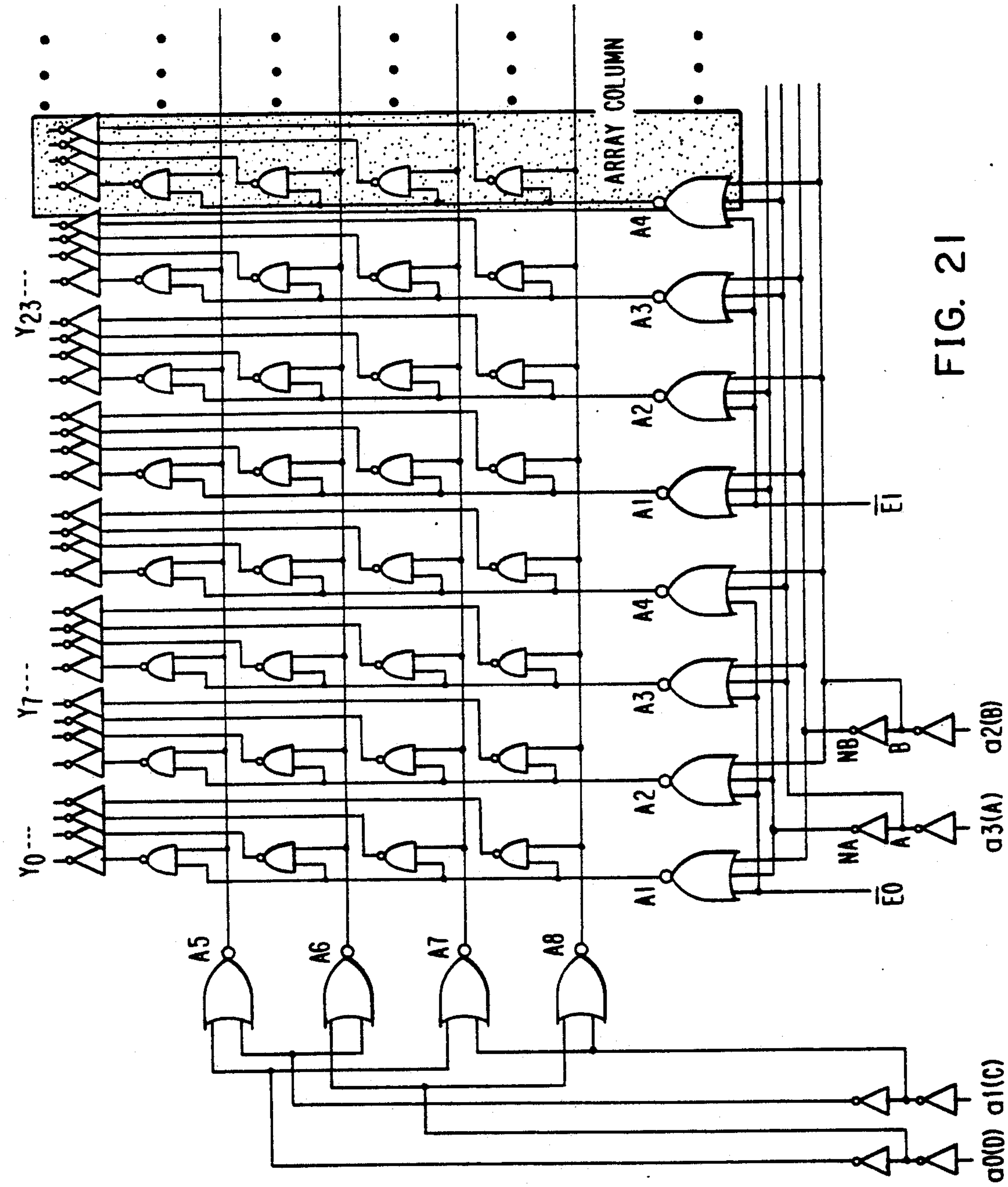
FIG. 21 is an alternative logic implementation of a decoder according to the invention.

An alternative embodiment of the invention is shown in FIG. 21 wherein subdecoders located outside the high density array area below a memory cells array comprise NOR gates and the high density decoder arrays comprise NANDs gates.

In summary, the described embodiments of the invention include a subdecoder located outside a high density region that decodes the four low order bits of an eight bit address signal. The resultant eight subfunctions are applied to sixteen high density 4×4 arrays of OR gates. A selected one of the array decoders is enabled in response to the four high order address signal bits decoded by a select decoder. This structure provides a high density decoder compatible with DRAM, SRAM, EPROM, ROM and other memories and devices requiring minimum address line pitch without requiring additional routing channels through the decoder.

While there have been described and illustrated several specific embodiments of the invention, it will be clear that variations in the details of embodiments specifically illustrated and described may be made without departing from the true spirit and scope of the invention as defined in the appended claims.

We claim:

1. An address signal decoder for providing decoded address signals to respective word lines in response to an address signal, comprising:
- pluralities of first and second subdecoder output lines arrayed in rows and columns to form a plurality of matrices extending in a row direction;
- a rectangular column subdecoder for receiving a first portion of said address signal and supplying first subdecoded address signals to respective first subdecoder output lines;
- a plurality of rectangular row subdecoders formed outside said matrices and extending in said row direction, each decoder for receiving a second portion of said address signal and each supplying second subdecoded address signals to respective second subdecoder output lines; and
- a plurality of first combinational logic elements connected to corresponding first and second subdecoder output lines for responding to said first and second subdecoded address signals to supply decoded address signals to respective word lines.

2. The decoder according to claim 1 wherein said first combinational logic elements are located at intersections of said first and second subdecoder output lines.

3. The decoder according to claim 1 wherein said first combinational logic elements comprise means for supplying logical sums of said first and second subdecoded address signals.

4. The decoder according to claim 1 wherein said first combinational logic elements comprise means for supplying logical products of said first and second subdecoded address signals.

5. The decoder according to claim 1 further comprising a plurality of driver circuits wherein said first combination logic elements supply said decoded address signals to said respective word lines through said driver circuits.

6. The decoder according to claim 1 wherein said column subdecoder comprises a plurality of second combinational logic circuits for receiving said first portion of said address signal and supplying said first subdecoded address signals to said first subdecoder output lines, and said row subdecoders each comprise a plurality of third combinational logic circuits for receiving said second portion of said address signal and supplying said second subdecoded address signals to said second subdecoder output lines.

7. The decoder according to claim 6 wherein
- said first portion of said address signal includes a plurality of first bit signals and said second combination logic circuits comprise means for supplying logical products of said first bit signals; and
- said second portion of said address signal includes a plurality of second bit signals and said third combination logic circuits comprise means for supplying logical products of said second bit signals.

8. The decoder according to claim 7 wherein said first combinational logic elements comprise gate means for supplying the logical sums of said first and second subdecoded address signals.

9. The decoder according to claim 8 wherein said means for supplying logical products of said first and second bit signals comprise NAND gates and said gate means for supplying the logical sum of said first and second subdecoded address signals comprise OR gates.

10. The decoder according to claim 6 wherein
- said first portion of said address signal includes a plurality of first bit signals and said second combination logic circuits comprise means for supplying logical sums of said first bit signals; and
- said second portion of said address signal includes a plurality of second bit signals and said third combination logic circuits comprise means for supplying logical sums of said second bit signals.

11. The decoder according to claim 10 wherein said first combinational logic elements comprise gate means for supplying logical products of said first and second subdecoded address signals.

12. The decoder according to claim 11 wherein said means for supplying logical sums of said first and second bit signals comprise NOR gates and said gate means for supplying the logical products of said first and second subdecoded address signals comprise NAND gates.

13. The decoder according to claim 1 wherein said pluralities of first and second subdecoder output lines comprise four each.

14. The decoder according to claim 13 wherein
- said first combinational logic elements comprise gates of a first logic type for supplying said decoded address signal;
- said column subdecoder comprises first through fourth gates of a second logic type for receiving said first portion of said address signal and supplying said first subdecoded address signals to said first subdecoder output lines; and
- said row subdecoders comprise fifth through eighth gates of said second logic type for receiving said second portion of said address signal and supplying said second subdecoded address signals to said second subdecoder output lines.

15. The address signal decoder according to claim 14 wherein said gates of said first logic type comprise first logic means for supplying the logical sums of said first and second subdecoded address signals.

16. The address signal decoder according to claim 15 wherein said gates of said second logic type comprise second logic means for supplying the logical products of said first and second portions of said address signal.

17. The address signal decoder according to claim 14 wherein said gates of said first logic type comprise first logic means for supplying the logical products of said first and second subdecoded address signals 18. The address signal decoder according to claim 17 wherein said gates of said second logic type comprise second logic means for supplying the logical sums of said first and second portions of said address signal.

19. The decoder according to claim 13 wherein said first combinational logic elements comprise gate means for supplying the logical products of said first and second subdecoded address signals;

said column subdecoder comprises first through fourth NOR gates for receiving said first portion of said address signal and supplying said first subdecoded address signals to said first subdecoder output lines; and said row subdecoders comprise fifth through eighth NOR gates for receiving said second portion of said address signal and supplying said second subdecoded address signals to said second subdecoder output lines.

20. The address signal decoder according to claim 19 wherein said gate means for supplying the logical products of the first and second subdecoded address signals comprises first through sixteenth NAND gates.

21. The decoder according to claim 13 wherein said first combinational logic elements comprise gate means for supplying the logical sums of said first and second subdecoded address signals;

said column subdecoder comprises first through fourth NAND gates for receiving said first portion of said address signal and supplying said first subdecoded address signals to said first subdecoder output lines; and said row subdecoders comprise fifth through eighth NAND gates for receiving said second portion of said address signal and supplying said second subdecoded address signals to said second subdecoder output lines.

22. The address signal decoder according to claim 21 wherein said gate means for supplying the logical sums of the first and second subdecoded address signals comprises first through sixteenth MR gates.

23. A semiconductor memory having an address decoder formed on a common substrate as the memory, the semiconductor memory including a matrix of bit lines and word lines extending in respective row and column directions and a plurality of memory cells at cross-overs of said bit and word lines, said word lines being uniformly spaced apart to have a predetermined first pitch, said address signal decoder comprising:

a decoder matrix of first combinational logic devices arrayed in adjacent rows of logic circuit benches, said benches being substantially uniformly spaced in said column direction to have a predetermined second pitch, each bench including a plurality of basic cells uniformly spaced in said row direction to have said first predetermined pitch, each of said logic devices including a predetermined number of said basic cells including first and second input nodes and an output node connected to a respective word line;

a first address signal subdecoder for receiving a first portion of an address signal and including a plurality of second combinational logic circuits formed outside said decoder matrix for supplying first subdecoded address signals;

a plurality of first subdecoder signal lines arrayed in rows within said decoder matrix, said first subdecoder signal lines being substantially uniformly spaced in said column direction to have a pitch substantially equal to said second pitch, said first subdecoder signal lines receiving said first subdecoded address signals and being connected to said first input nodes of said combinational logic devices in respective rows;

a second address signal subdecoder for receiving a second portion of said address signal and including a plurality of third combinational logic circuits formed outside said decoder matrix for supplying second subdecoded address signals; and a plurality second subdecoder signal lines arrayed in columns within said decoder matrix having a pitch equal to approximately four times said second pitch, said second subdecoder signal lines receiving said second subdecoded address signals and being connected to said second input nodes of said combinational logic devices in respective columns.

24. The semiconductor memory according to claim 23 wherein said second combinational logic circuits are arrayed in a column outside said decoder matrix and said third combinational logic circuits are arrayed in a column outside said decoder matrix.

25. The semiconductor memory according to claim 23 wherein said decoder matrix includes sixteen of said first combinational logic devices arrayed in first through fourth adjacent logic circuit benches, each of said benches including sixteen of said basic cells forming four of said first combinational logic devices.

26. The semiconductor memory according to claim 25 including four first subdecoder signal lines formed in respective benches and four second subdecoder signal lines.

27. The semiconductor memory according to claim 23 wherein said first combinational logic elements are located at crossovers of said first and second subdecoder signal lines.

28. The semiconductor memory according to claim 23 wherein said first combinational logic elements comprise means for supplying logical sums of signal said subdecoded address signals.

29. The semiconductor memory according to claim 23 wherein said first combinational logic elements comprise means for supplying logical products of said subdecoded address signals.

30. The semiconductor memory according to claim 23 further comprising a plurality of driver circuits wherein said first combinational logic elements supply said decoded address signals to said respective word lines through said driver circuits.

31. The semiconductor memory according to claim 23 wherein said first address signal subdecoder comprises a plurality of second combinational logic circuits for receiving said first portion of said address signal and supplying said first subdecoded address signals to said first subdecoder signal lines, and said second subdecoder comprises a plurality of third combinational logic circuits for receiving said second portion of said address signal and supplying said second subdecoded address signal to said second subdecoder signal lines.

32. The semiconductor memory according to claim 31 wherein said first portion of said address signal includes a plurality of first bit signals and said second combination logic circuits comprise means for supplying logical produces of said first bit signals; and said second portion of said address signal includes a plurality of second bit signals and said third combination logic circuits comprise means for supplying logical products of said second bit signals.

33. The semiconductor memory according to claim 32 wherein said first combinational logic elements comprise means for supplying the logical sum of said first and second subdecoded address signals.

34. The semiconductor memory according to claim 33 wherein said means for supplying the logical products of said first and second bit signals comprise NAND gates and said means for supplying the logical sum of said first and second subdecoded address signals comprise OR gates.

35. The semiconductor memory according to claim 31 wherein said first portion of said address signal includes a plurality of first bit signals and said second combination logic circuits comprise means for supplying logical sums of said first bit signals; and said second portion of said address signal includes a plurality of second bit signals and said third combination logic circuits comprise means for supplying logical sums of said second bit signals.

36. The semiconductor memory according to claim 35 wherein said first combinational logic elements comprise means for supplying the logical products of said first and second subdecoded address signals.

37. The semiconductor memory according to claim 36 wherein said means for supplying logical sums of said first and second bit signals comprise NOR gates and said means for supplying the logical product of said first and second subdecoded address signals comprise NAND gates.

38. The semiconductor memory according to claim 23 wherein said first combinational logic elements comprise means for supplying the logical sum of said first and second subdecoded address signals;

said column subdecoder comprises first through fourth NAND gates for receiving said first portion of said address signal and supplying said first subdecoded address signals to said first subdecoder output lines; and said row subdecoder comprises fifth through eighth NAND gates for receiving said second portion of said address signal and supplying said second subdecoded address signal to said second subdecoder output lines.

39. A semiconductor memory comprising:

an array of n (wherein n is an integral multiple of 4) substantially uniformly spaced word lines extending in a column direction and m bit lines extending in a row direction substantially orthogonal to said column direction;

a plurality of memory cells connected to respective ones of said word lines and said bit lines; and an address signal decoder including (i) a matrix of 16 combinational logic elements arranged in a square array having first through fourth rows and first through fourth columns, each of said combinational elements having a first and second input node and an output node connected to a respective one of said word lines;

(ii) a first address signal subdecoder for receiving a first portion of an address signal and, in response, supplying respective first through fourth subdecoded address signals at respective first through fourth output nodes;

(iii) a second address subdecoder for receiving a second portion of said address signal and, in response, supplying respective fifth through eighth subdecoded address signals at respective fifth through eighth output nodes;

(iv) first through fourth subdecoder signal lines extending in said row direction from respective ones of said first through fourth output nodes of said first subdecoder to first terminals of said combinational logic elements in respective ones of said first through fourth rows; and (v) fifth through eighth subdecoder signal lines extending in said column direction from respective one of said fifth through eighth output nodes of said second subdecoder to second terminals of said combinational logic elements in respective ones of said first through fourth columns.

40. An address signal decoder for providing decoded address signals to respective word lines in response to an address signal, comprising:

pluralities of first and second subdecoder output lines arrayed in rows and columns to form a plurality of matrices extending in a row direction;

a rectangular column subdecoder for receiving a first portion of said address signal and supplying first subdecoded address signals to respective first subdecoder output lines;

a plurality of rectangular row subdecoders formed outside said matrices and extending in said row direction, each for receiving a second portion of said address signal and each supplying second subdecoded address signals to respective second subdecoder output lines; and a plurality of first combinational logic elements, each having only two input nodes connected to corresponding first and second subdecoder output lines for responding to said first and second subdecoded address signals to supply decoded address signals to respective word lines.

* * * * *